(12) United States Patent
Orita

(10) Patent No.: US 7,161,188 B2
(45) Date of Patent: Jan. 9, 2007

(54) SEMICONDUCTOR LIGHT EMITTING ELEMENT, SEMICONDUCTOR LIGHT EMITTING DEVICE, AND METHOD FOR FABRICATING SEMICONDUCTOR LIGHT EMITTING ELEMENT

(75) Inventor: Kenji Orita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/117,406

(22) Filed: Apr. 29, 2005

(65) Prior Publication Data
US 2005/0285132 A1   Dec. 29, 2005

(30) Foreign Application Priority Data
Jun. 28, 2004  (JP) ............... 2004-189892

(51) Int. Cl.
H01L 33/00   (2006.01)
(52) U.S. Cl. ................... 257/98; 257/E33.074
(58) Field of Classification Search ............. 257/98, 257/E33.025, E33.074
See application file for complete search history.

(56) References Cited

U.S. PATENT DOCUMENTS 6,495,862 B1 * 12/2002 Okazaki et al. ............. 257/103

2004/0016936 A1 * 1/2004 Tanaka et al. ............ 257/98
2005/0029528 A1 * 2/2005 Ishikawa .................. 257/79

FOREIGN PATENT DOCUMENTS

JP    2000-196152 A    7/2000
JP    2004-128445 A    4/2004

* cited by examiner

Primary Examiner—Lex H. Malsawma
(74) Attorney, Agent, or Firm—McDermott Will & Emery LLP

(57) ABSTRACT

Projections/depressions forming a two-dimensional periodic structure are formed in a surface of a semiconductor multilayer film opposing the principal surface thereof, while a metal electrode with a high reflectivity is formed on the other surface. By using the diffracting effect of the two-dimensional periodic structure, the efficiency of light extraction from the surface formed with the projections/depressions can be improved. By reflecting light emitted toward the metal electrode to the surface formed with the projections/depressions by using the metal electrode with the high reflectivity, the foregoing effect achieved by the two-dimensional periodic structure can be multiplied.

18 Claims, 32 Drawing Sheets

When Incident Angle is Small

When Incident Angle is Large

Period = 0.1 μm

Incident Angle = 0 Degree

Period = 0.1 μm

Incident Angle = 70 Degree

Period = 0.2 μm
Incident Angle = 0 Degrees

Period = 0.2 μm
Incident Angle = 35 Degrees

Period = 0.2 μm
Incident Angle = 70 Degrees

Period = 0.4 μm
Incident Angle = 0 Degrees

Period = 0.4 μm
Incident Angle = 35 Degrees

Period = 0.4 μm
Incident Angle = 70 Degrees

Period

Period

Period

Irradiation with KrF Laser (248 nm)

Irradiation with KrF Laser (248 nm)

SEMICONDUCTOR LIGHT EMITTING ELEMENT, SEMICONDUCTOR LIGHT EMITTING DEVICE, AND METHOD FOR FABRICATING SEMICONDUCTOR LIGHT EMITTING ELEMENT

CROSS REFERENCE TO RELATED APPLICATIONS

The present application claims priority under 35 U.S.C. § 119(a) to Japanese Patent Application JP 2004-189892, filed Jun. 28, 2004, the entire content of which is incorporated herein by reference.

BACKGROUND OF THE INVENTION

1. Technical Field to which the Invention Pertains

The present invention relates to a light emitting element using a semiconductor and to a method for fabricating the same.

2. Prior Art

The use of a nitride-based compound semiconductor represented by AlInGaN has enabled the commercialization of light emitting elements which output light at the ultraviolet, blue, and green wavelengths from which it has heretofore been difficult to obtain a sufficient emission intensity, such as a light emitting diode (LED) and a semiconductor laser, so that research and development thereof has been conducted vigorously. Among light-emitting elements, an LED is easier to fabricate and control than a semiconductor laser and longer in lifespan than a fluorescent lamp so that the LED, particularly using a nitride-based compound semiconductor, is considered to be promising as a light source for illumination.

FIG. 34 is a perspective view showing a conventional nitride-based compound semiconductor LED. The conventional LED has a structure in which an n-type GaN layer 1002, an InGaN active layer 1003, and a p-type GaN layer 1004 are formed successively through crystal growth on a sapphire substrate 1001. Each of the InGaN active layer 1003 and the p-type GaN layer 1004 has been removed partly by etching so that the n-type GaN layer 1002 is exposed. An n-side electrode 1006 is formed on the exposed portion of the n-type GaN layer 1002. A p-side bonding electrode 1007 is provided on the p-type GaN layer 1004.

The following is the operation of the LED.

First, holes injected from the p-side bonding electrode 1007 are diffused laterally in a p-type transparent electrode 1005 to be injected from the p-type GaN layer 1004 into the InGaN active layer 1003.

On the other hand, electrons injected from the n-side electrode 1006 are further injected into the InGaN active layer 1003 through the n-type GaN layer 1002. The recombination of the holes and the electrons in the InGaN active layer 1003 causes light emission. The light is emitted to the outside of the LED through the p-side transparent electrode 1005.

However, it cannot be said that such a conventional structure has sufficiently high light extraction efficiency. The light extraction efficiency is the ratio of light generated in the active layer and emitted from the LED into an air to all the light generated in the active layer. The cause of the low light extraction efficiency of the conventional LED is the refractive index of a semiconductor which is higher than that of the air so that the light from the active layer is totally reflected by the interface between the semiconductor and the air and confined to the inside of the LED. For example, the refractive index of GaN is about 2.45 at a wavelength of 480 nm so that a critical angle at which total reflection occurs is as small as about 23 degrees. That is, the light emitted from the active layer at an angle larger than the critical refraction angle in terms of a normal to the interface between the semiconductor and the air is totally reflected by the interface between the semiconductor and the air so that the light emitted from the active layer and extractable to the outside of the LED accounts for only about 4% of all the light emitted from the active layer. Accordingly, the problem is encountered that external quantum efficiency (the ratio of light that can be extracted from the LED to currents supplied to the LED) is low and power conversion efficiency (the ratio of a light output that can be produced to all the supplied power) is lower than that of a fluorescent lamp.

As a solution to the problem, a technology which forms a photonic crystal at the surface of the LED has been proposed, as disclosed in Japanese Laid-Open Patent Publication No. 2000-196152.

FIG. 35 is a perspective view showing a conventional LED having an upper surface formed with a photonic crystal. As shown in the drawing, two-dimensional periodic projections/depressions are formed in the p-type GaN layer 1004 according to the conventional embodiment. In the structure, even light emitted from the active layer at an angle larger than the critical refraction angle in terms of the normal to the interface between the semiconductor and the air can have the direction of emission at an angle smaller than the critical refraction angle due to diffraction by the periodic projection/depressions. This increases the ratio of light emitted to the outside of the LED without being totally reflected and improves the light extraction efficiency. In the present specification, the wording "two-dimensional periodic" indicates that a structure is formed to have given spacings (a given period) along a first direction in a plane, while it is also formed to have given spacings (a given period) along a second direction crossing the first direction.

SUMMARY OF THE INVENTION

However, there are cases where the following problems occur when projections/depressions are formed in the surface of the LED close to the active layer, such as in the p-type GaN layer.

Since the p-type GaN layer 1004 has a high resistivity, the film thickness thereof is preferably as thin as about 0.2 μm in terms of reducing the series resistance of the LED and achieving high-efficiency light emission. To form the projections/depressions in the upper surface of the p-type GaN layer 1004, however, it is necessary to increase the film thickness of the p-type GaN layer 1004. As a result, there are cases where the series resistance of a conventional LED as shown in FIG. 35 increases and the power conversion efficiency thereof lowers. In addition, dry etching for forming the projections/depressions in the p-type GaN layer 1004 causes a crystal defect in the surface of the p-type GaN layer 1004. Since such a crystal defect functions as an electron donor, an electron density in the surface of the n-type GaN layer 1002 increases and the contact resistance thereof lowers. In the p-type GaN layer 1004, however, the crystal defect resulting from an etching damage compensates for the holes so that the formation of an ohmic electrode becomes difficult. This leads to the problem that the contact resistivity increases and the power conversion efficiency lowers. Since the projections/depressions are close to the active layer, etching-induced damage occurs in the active layer during the formation of the projections/depressions. Consequently, the problems of a reduction in internal quantum efficiency (the ratio of electron-hole pairs that are recombined in the active layer and converted to photons to all the electron-hole pairs recombined in the active layer) in the active layer and a reduction in the light emission efficiency of the LED are also likely to occur.

The surface of the LED in which a two-dimensional photonic crystal can conceivably be formed is the main or back surface thereof. In this case, the back surface of the substrate and the interface between the substrate and the semiconductor can be considered as two locations at either of which the photonic crystal is to be formed. In either case, however, the following problem is encountered when the photonic crystal is formed by using the conventional technology. In the case of forming the photonic crystal at the back surface of the substrate, total reflection occurs at the interface between the semiconductor and the substrate so that the effect of improving the light extraction efficiency achieved by the photonic crystal formed in the back surface of the substrate is lower than when the photonic crystal is formed in the semiconductor. In the case of forming the photonic crystal at the interface between the semiconductor and the substrate, on the other hand, the efficiency of diffraction by the periodic projections/depressions lowers due to a small refractive index difference between the semiconductor and the substrate so that the effect of improving the light extraction efficiency is lower than when the photonic crystal is formed at the uppermost surface of the LED.

It is therefore an object of the present invention to provide a semiconductor light emitting element with a light extraction efficiency higher than achieved conventionally.

A first semiconductor light emitting element according to the present invention comprises: an active layer made of a semiconductor and generating light; a first semiconductor layer of a first conductivity type formed through crystal growth on a principal surface of the active layer; and a second semiconductor layer of a second conductivity type provided on a back surface of the active layer and having a back surface formed with a two-dimensional periodic structure, the semiconductor light emitting element outputting light generated in the active layer from the back surface of the second semiconductor layer.

In the arrangement, the two-dimensional periodic structure formed in the back surface of the second semiconductor layer reduces damage received by the element during the fabrication thereof and thereby improves power conversion efficiency to a level higher than achieved conventionally.

The first semiconductor light emitting element further comprises: a first electrode provided on a principal surface of the first semiconductor layer and having a reflectivity of 80% or more with respect to light at a peak wavelength of all the light generated in the active layer; and a second electrode provided on a region of the back surface of the second semiconductor layer in which the two-dimensional periodic structure is not formed. The arrangement allows the light emitted from the active layer toward the first electrode to be reflected efficiently to the two-dimensional periodic structure in the surface of the semiconductor multilayer film and thereby allows the light extraction efficiency achieved by the two-dimensional periodic structure to be approximately doubled.

In particular, the first electrode is preferably a metal film containing at least one of an Au film, a Pt film, a Cu film, an Ag film, an Al film, and a Rh film in terms of practical use. A metal layer having a thickness of 10 μm or more is further provided in contact relation with the first electrode.

The arrangement allows effective conduction of heat generated in the active layer so that the occurrence of a faulty operation is suppressed.

In particular, the metal layer is composed of one metal selected from the group consisting of Au, Cu, and Ag. The arrangement is preferred since it allows efficient transfer of heat to the outside and it can be formed easily by using a plating technology.

When a period of the two-dimensional periodic structure is $\Lambda$, a peak wavelength of the light generated in the active layer is $\lambda$, and a refractive index of the second semiconductor layer is N, $0.5\lambda/N<\Lambda<20\lambda/N$ is preferably satisfied. In the case where $0.5\lambda/N>\Lambda$ is satisfied, an angle change caused by diffraction is large and the angle of the diffracted light exceeds the total reflection critical angle so that it is not emitted to the outside of the semiconductor light emitting element. In this case, diffraction with a two-dimensional period cannot improve the light extraction efficiency. In the case where $\Lambda>20\lambda/N$ is satisfied, the period becomes extremely larger than the wavelength of the light emitted from the active layer so that the effect of diffraction is hardly expected.

When a height of the two-dimensional periodic structure is h, a peak wavelength of the light generated in the active layer is $\lambda$, a refractive index of a portion surrounding the semiconductor light emitting element is $n_1$, and a refractive index of the second semiconductor layer is $n_2$, h is an integral multiple of $\lambda/\{2(n_2-n_1)\}$. This results in a phase difference which causes a light component passing through the upper portions of the projections/depressions of the two-dimensional periodic structure and a light component passing through the lower portions of the projections/depressions to conductivity interfere with each other. Consequently, the efficiency of diffraction caused by the two-dimensional periodic structure can be maximized and the light extraction efficiency can be improved.

Depending on a material composing the two-dimensional periodic structure, a vertical cross section of the two-dimensional periodic structure may be configured as either a quadrilateral or a triangular wave.

A second semiconductor light emitting element according to the present invention comprises: a substrate which transmits light; a first semiconductor layer formed through crystal growth on a principal surface of the substrate and having a principal surface formed with a two-dimensional periodic structure; a second semiconductor layer of a first conductivity type provided on the principal surface of the first semiconductor layer; an active layer provided on a principal surface of the second semiconductor layer, made of a semiconductor, and generating light; and a third semiconductor layer of a second conductivity type provided on a principal surface of the active layer, the semiconductor light emitting element outputting the light generated in the active layer from a back surface of the substrate.

The arrangement allows the improvement of the diffraction efficiency without removing the substrate and thereby allows easier fabrication than in the case where the substrate is removed.

A material composing the second semiconductor layer is not buried in the two-dimensional periodic structure. Since the arrangement allows an increase in the refractive index difference between the two-dimensional periodic structure and a portion surrounding the two-dimensional periodic structure, it becomes possible to increase the diffraction efficiency and improve the light extraction efficiency.

Preferably, a material of the substrate is one selected from the group consisting of GaAs, InP, Si, SiC, AlN, and sapphire. If the substrate is made of GaAs, InP, or Si, it can be removed easily by wet etching. Even if the substrate is made of AlN, sapphire, or SiC, it can be removed by dry etching. If the substrate is made of a transparent material such as AlN or sapphire, it can be removed by a laser lift-off process.

The back surface of the substrate is rough and, when a peak wavelength of the light generated in the active layer is λ, an autocorrelation distance T in the back surface of the substrate satisfies $0.5\lambda/N<T<20\lambda/N$ and a height distribution D in a perpendicular direction satisfies $0.5\lambda/N<D<20\lambda/N$. This scatters the light and allows the light generated in the active layer to be emitted efficiently to the outside of the substrate.

A semiconductor light emitting device according to the present invention comprises: a semiconductor light emitting element having a first semiconductor layer of a first conductivity type, an active layer provided on a back surface of the first semiconductor layer, made of a semiconductor, and generating light, and a second semiconductor layer of a second conductivity type provided on a back surface of the active layer and having a back surface formed with a two-dimensional periodic structure, the semiconductor light emitting element outputting the light generated in the active layer from the back surface of the second semiconductor layer; a mounting substrate on which the semiconductor light emitting element is mounted; and a molding resin formed into a hemispherical configuration to mold the semiconductor light emitting element.

The arrangement allows significant improvement of the light extraction efficiency. This is because the light extracted from the semiconductor light emitting element into the resin by the two-dimensional periodic structure is incident perpendicularly to the interface between the resin and the air due to the hemispherical form of the resin and emitted into the air with approximately 100% efficiency.

A method for fabricating a semiconductor light emitting element according to the present invention comprises the steps of: (a) forming a first two-dimensional periodic structure in a principal surface of a substrate or in a principal surface of a semiconductor layer provided on the substrate; and (b) successively forming a first semiconductor layer, an active layer, and a second semiconductor layer over the first two-dimensional periodic structure.

The method makes it possible to form the two-dimensional periodic structure without damaging the first semiconductor.

The step (b) may also include the step of forming, in a back surface of the first semiconductor layer, a second two-dimensional periodic structure which is complementary to the first two-dimensional periodic structure by forming the first semiconductor layer in such a manner that the first two-dimensional periodic structure is filled therewith.

The method further comprises the step of: (c) after the step (b), removing the substrate or the substrate and the semiconductor layer to expose the second two-dimensional periodic structure. The arrangement allows an increase in the refractive index difference between the material composing the second two-dimensional periodic structure and a portion surrounding the second two-dimensional periodic structure and thereby allows the improvement of the diffraction efficiency of the semiconductor light emitting element.

The step (c) may also be performed by polishing the substrate and by wet etching.

The step (c) is performed by a laser lift-off process. This allows the substrate to be removed in a relatively short period of time.

The substrate removed in the step (c) is reusable. This achieves a reduction in fabrication cost.

The method further comprises the step of: after the step (b), forming a high-reflection film composed of a metal film containing at least one of an Au film, a Pt film, a Cu film, an Ag film, an Al film, and a Rh film on a principal surface of the second semiconductor layer. The arrangement allows the fabrication of the semiconductor light emitting element with a higher light extraction efficiency.

The method further comprises the step of: after the step (c), performing wet etching under a condition where an etching speed differs depending on a crystal plane to form the second two-dimensional periodic structure composed of projections or depressions each configured as a polygonal pyramid. The arrangement allows the fabrication of the semiconductor light emitting element with a higher light extraction efficiency. By thus properly adjusting the configuration of each of the projections or depressions through wet etching, design flexibility can be increased.

The step (b) may also include the step of forming the first semiconductor layer in such a manner as to form a cavity in the first two-dimensional periodic structure.

The first two-dimensional periodic structure may also be composed of a structure made of at least any one of an oxide, a nitride, and a metal.

The second two-dimensional periodic structure is composed of depressions and the method further comprises the step of: after the steps (b) and (c), increasing a depth of each of the depressions or changing a cross-sectional configuration of each of the depressions by allowing electricity to flow in the semiconductor light emitting element in an electrolytic solution. The arrangement allows the angle between the inner side surface of each of the depressions and the surface of the substrate to consequently approach 90 degrees and thereby allows the improvement of the light extraction efficiency by using the second two-dimensional periodic structure.

The step (a) includes the steps of: (a1) coating a first resist on the principal surface of the substrate or of the semiconductor layer; (a2) pressing, against the first resist, a mold formed with a two-dimensional periodic structure which is complementary to the first two-dimensional periodic structure to transfer a pattern which is homologous to the first two-dimensional periodic structure thereto; and (a3) forming the first two-dimensional periodic structure by using, as a mask, the first resist to which the pattern homologous to the first two-dimensional periodic structure has been transferred. Since the arrangement allows the transfer of an extremely fine pattern formed preliminarily in the mold, it facilitates micro-processing performed with respect to the thin film.

The first two-dimensional periodic structure is composed of a resin provided on the substrate and the method further comprises the steps of: (d) after the step (b), removing the substrate; (e) coating a second resist on a back surface of the first semiconductor layer; (f) placing the substrate formed with the first two-dimensional periodic structure on the second resist to transfer a pattern which is complementary to the first two-dimensional periodic structure to the second resist; and (g) forming a second two-dimensional periodic structure which is complementary to the first two-dimensional periodic structure in a back surface of the first semiconductor layer by using, as a mask, the second resist to which the pattern complementary to the first two-dimensional periodic structure has been transferred. Since the arrangement allows the transfer of an extremely fine pattern formed preliminarily in the mold, it facilitates micro-processing performed with respect to the thin film.

The method further comprises the steps of: mounting the semiconductor light emitting element on a mounting substrate; and molding the semiconductor light emitting element with a hemispherical resin by using a mold die formed with a hemispherical cavity. The arrangement allows the fabrication of the semiconductor light emitting element with higher light extraction efficiency. By molding the resin by using the mold die, it becomes possible to stably manufacture semiconductor light emitting elements having uniform configurations.

DESCRIPTION OF THE PREFERRED EMBODIMENTS

The present invention will be described more specifically in accordance with the individual embodiments thereof. In the present specification, the surface of a semiconductor layer formed by epitaxial growth which is in the direction of crystal growth will be termed a principal surface and the surface thereof opposite to the principal surface will be termed a back surface.

Embodiment 1

Structure of Light Emitting Element

Figure 1:
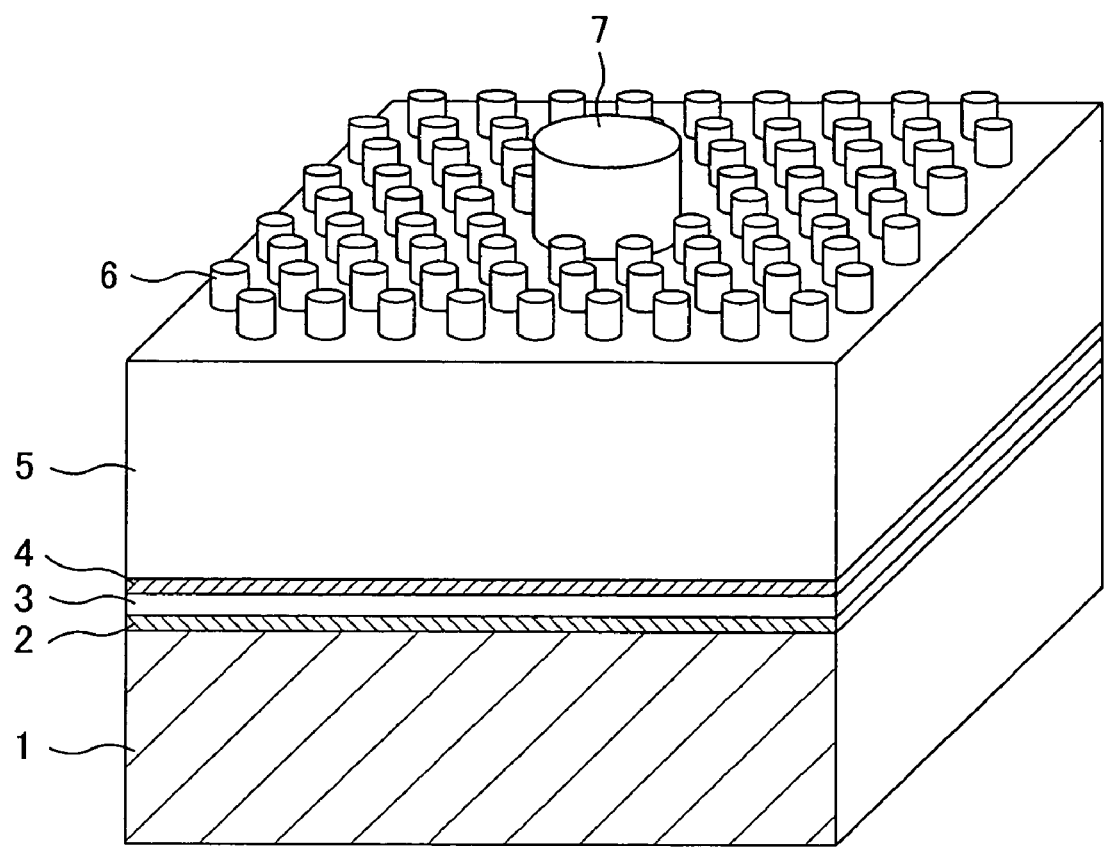
FIG. 1 is a perspective view showing a semiconductor light emitting element according to a first embodiment of the present invention.

FIG. 1 is a perspective view showing a semiconductor light emitting element according to a first embodiment of the present invention. As shown in the drawing, the semiconductor light emitting element according to the present embodiment comprises: a p-type GaN layer (first semiconductor layer) 3 formed by epitaxial growth and having a thickness of 200 nm; a high-reflection p electrode (first electrode) 2 formed on the crystal growing surface (principal surface) of the p-type GaN layer 3, made of platinum (Pt) and gold (Au) which are stacked in layers, and having a thickness of 1 µm; an Au plating layer 1 formed on the lower surface of the high-reflection p electrode 2 and having a thickness of 10 µm; a non-doped InGaN active layer 4 formed on the back surface of the p-type GaN layer 3 and having a thickness of 3 nm; an n-type GaN layer (second semiconductor layer) 5 formed on the back surface of the non-doped InGaN active layer 4, having a back surface formed with a projecting two-dimensional periodic structure 6, and having a thickness of 4 µm; and an n electrode (second electrode) 7 formed on the back surface of the n-type. GaN layer 5, made of titanium (Ti) and Al which are stacked in layers, and having a thickness of 1 µm. The lower surface used herein indicates the surface positioned in the lower part of FIG. 1. In the example shown in FIG. 1, the high-reflection p electrode 2 is provided on the entire principal surface of the p-type GaN layer 3 and the n electrode 7 is provided on a part of the back surface of the n-type GaN layer 5. The wording "non-doped" indicates that intentional doping has not been performed with respect to a layer of concern.

The semiconductor light emitting element according to the present embodiment functions as an LED from which light is extracted through the back surface of the n-type GaN layer 5. The PL peak wavelength of the non-doped InGaN active layer 4 is 405 nm. As will be described layer, MOCVD (Metal-Organic Chemical Vapor Deposition), MBE (Molecular Beam Epitaxy), or the like will be used as a method for the crystal growth of a nitride-based compound semiconductor composing the semiconductor light-emitting element.

The period of the two-dimensional periodic structure 6 formed in the back surface of the n-type GaN layer 5, i.e., the spacing between the respective centers of adjacent projections in a two-dimensional plane is 0.4 µm and the height of each of the projections is 150 nm.

Description of Diffraction at Surface of n-Type GaN Layer

A description will be given next to diffraction at the surface (back surface) of the n-type GaN layer of the semiconductor light emitting element according to the present embodiment based on the result of simulation.

Figure 2:
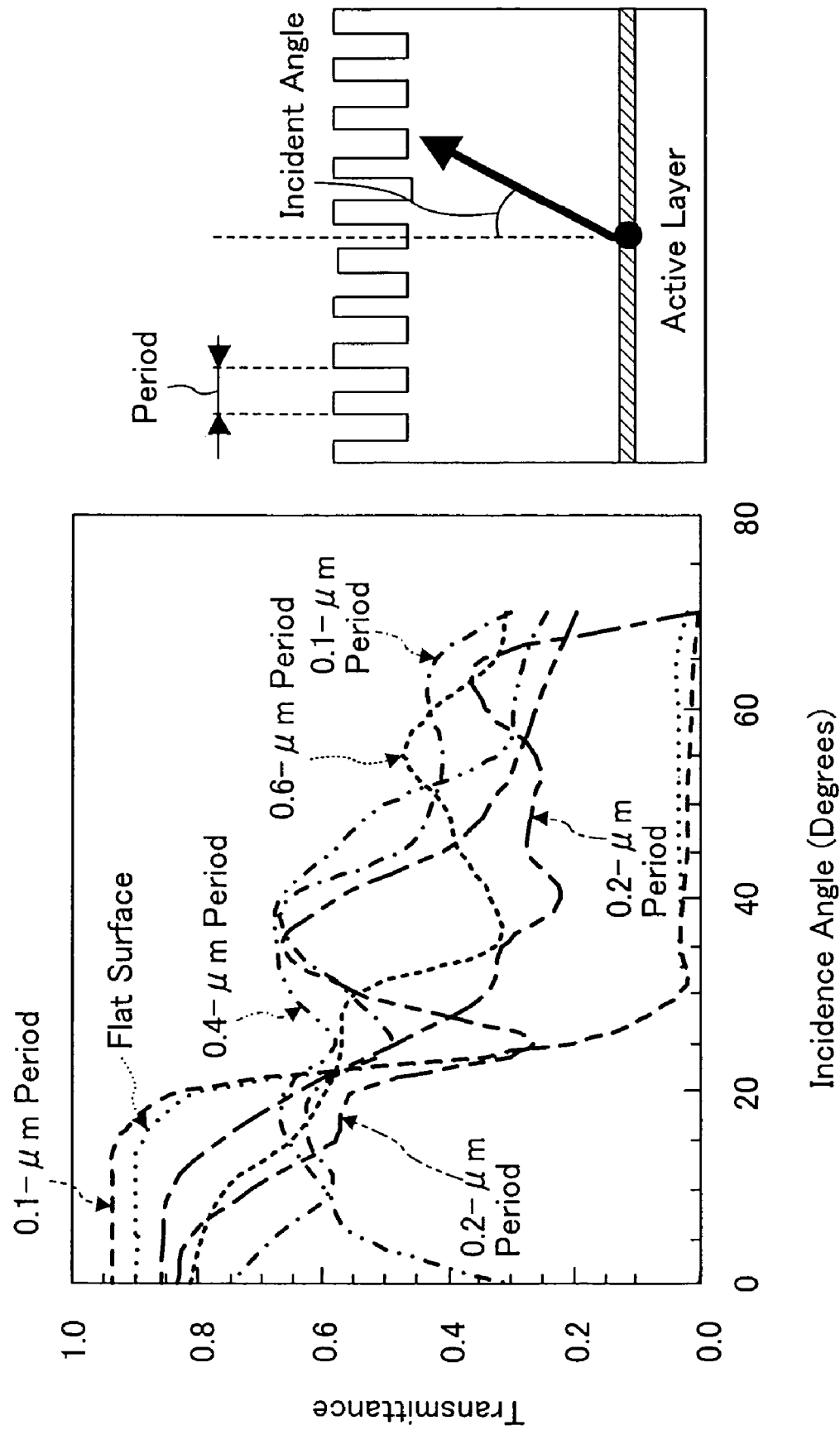
FIG. 2 is a view showing the result of theoretically calculating the incident-angle dependence of an amount of light emitted to the outside of the semiconductor light emitting element.

FIG. 2 is a view showing the result of theoretically calculating the incident-angle dependence of the transmittance of light emitted from the non-doped InGaN active layer and incident on the back surface (the upper surface in the drawing) of the n-type GaN layer, i.e., an amount of light emitted to the outside of the LED. For the theoretical calculation, numerical analysis in accordance with a FDTD (Finite Difference Time Domain) method was used. It is assumed that the incident angle when the light is incident perpendicularly to the back surface of the n-type GaN layer is zero degree.

As shown in FIG. 2, when the surface of the n-type GaN layer is smooth and flat, the transmittance is constant when the incident angle is in the range of zero degree to a total reflection critical angle $\theta c$ (since the refractive index of GaN is about 2.5, $\theta c = \sin^{-1}(1/2.5) =$ about 23 degrees is satisfied) and the value thereof is about 90%. The cause of the reflection of 10% of generated light and the returning of the reflected light to the inside of the LED is Fresnel reflection resulting from the refractive index difference between GaN and the air. The reason for the transmittance which becomes approximately zero when the incident angle exceeds the total reflection critical angle is that total reflection occurs at the interface between GaN and the air. The cause of the occurrence of the total reflection will be described with reference to FIG. 3.

Figure 3A:
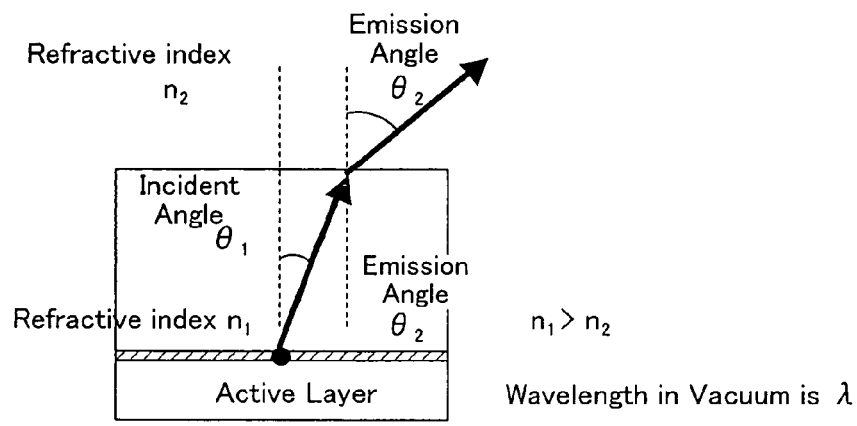
FIG. 3A is a view showing a structure of an LED in a real space and FIGS. 3B and 3C are views each showing a structure of the light emitting element in a wave-number space.
Figure 3B:
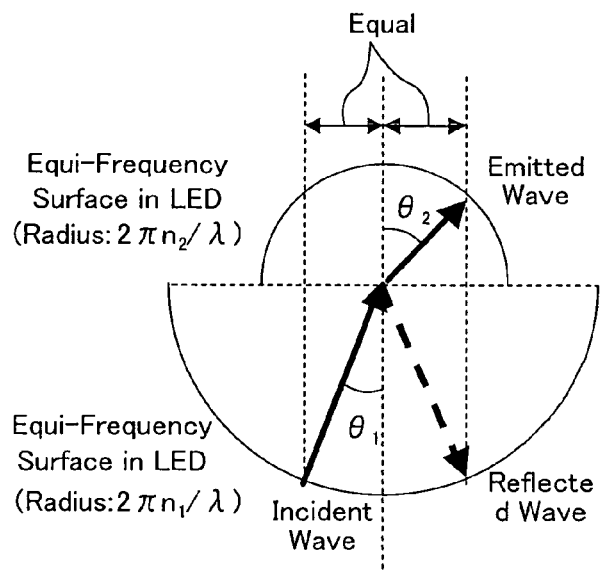
Figure 3C:
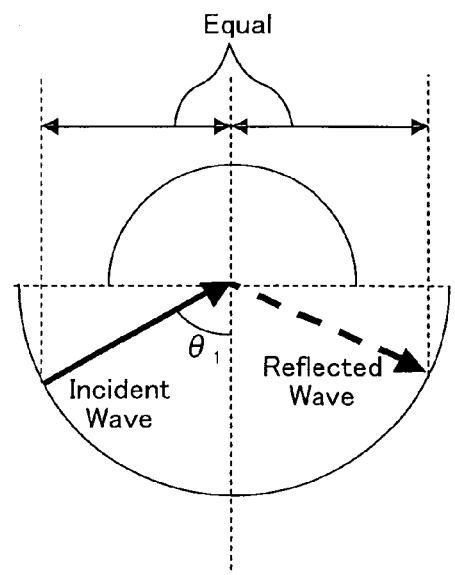

FIG. 3A is a view showing a structure of the LED in an actual space (1) and FIGS. 3B and 3C are views each showing a structure of the light emitting element in a wave-number space. FIG. 3B shows the case where the incident angle of light is small and FIG. 3C shows the case where the incident angle of light is large. The semi-circle in each of FIGS. 3B and 3C is an equi-frequency surface, which indicates the magnitude (Wave Number $k=2\pi n/\lambda$ where n is a refractive index and $\lambda$ is a wavelength in vacuum) of a wave vector to be satisfied by an incident wave, a reflected wave, and a transmitted wave in the LED and in the air. The semi-circle indicates the conservation law of photon energy ($h\omega/2\pi$, h is the Planck's constant). This is because the relationship given by $k=\omega n/c$ is established (c is a velocity of light in vacuum). When the structure in the actual space has translational symmetry relative to a horizontal direction as in the case (1) shown in FIG. 3A, there is the conservation law of a wave number component in the horizontal direction which should be observed by each of the incident wave, the reflected wave, and the transmitted wave (which is related to the phase continuity of an electromagnetic wave). The incident angle and an emission angle are determined to satisfy the foregoing two laws.

When the incident angle of light is small as shown in FIG. 3B, the light can be emitted into the air because the emission angle which satisfies the foregoing two laws exists. When the incident angle of light is large as shown in FIG. 3C, however, there is no emission angle which satisfies the wave number component in the horizontal direction so that the light cannot be emitted into the air. In this case, the transmittance T satisfies T=0 so that, when there is no absorption at the interface between the LED and the air, the reflectivity R satisfies R=1 since the conservation law of optical energy, which is T+R=1, should be satisfied. Consequently, light is totally reflected by the interface between the LED and the air. Even if a structure which reduces Fresnel reflection, such as a no-reflection film, is introduced into the interface between the LED and the air, R=1 is inevitably satisfied under a condition which satisfies the transmittance T=0 so that total reflection is inevitable.

Figure 4A:
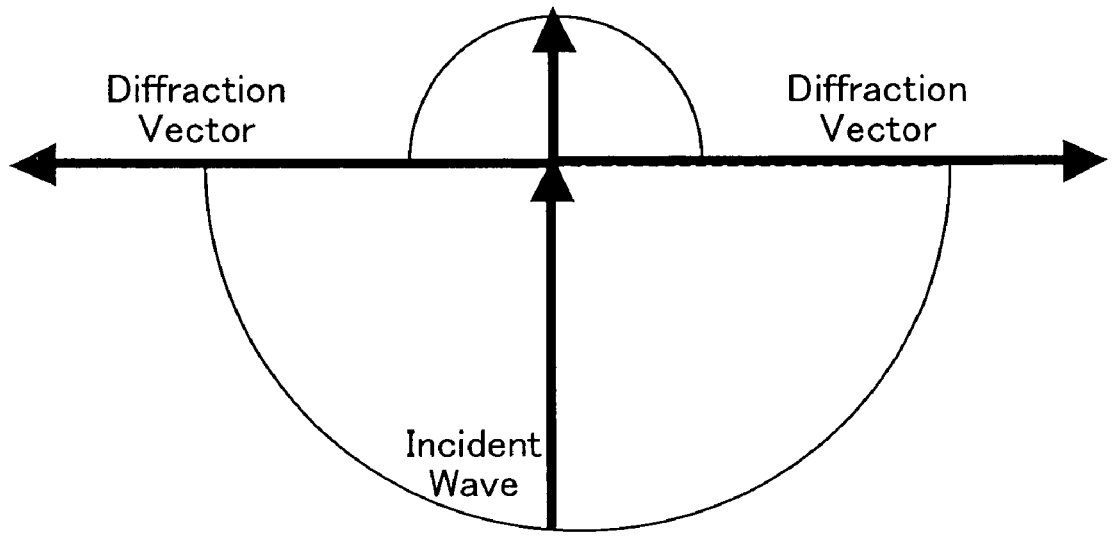
FIGS. 4A and 4B are views each showing a structure of the wave-number space when a two-dimensional periodic structure with a 0.1-μm period has been formed in the surface of an n-type GaN layer.
Figure 4B:
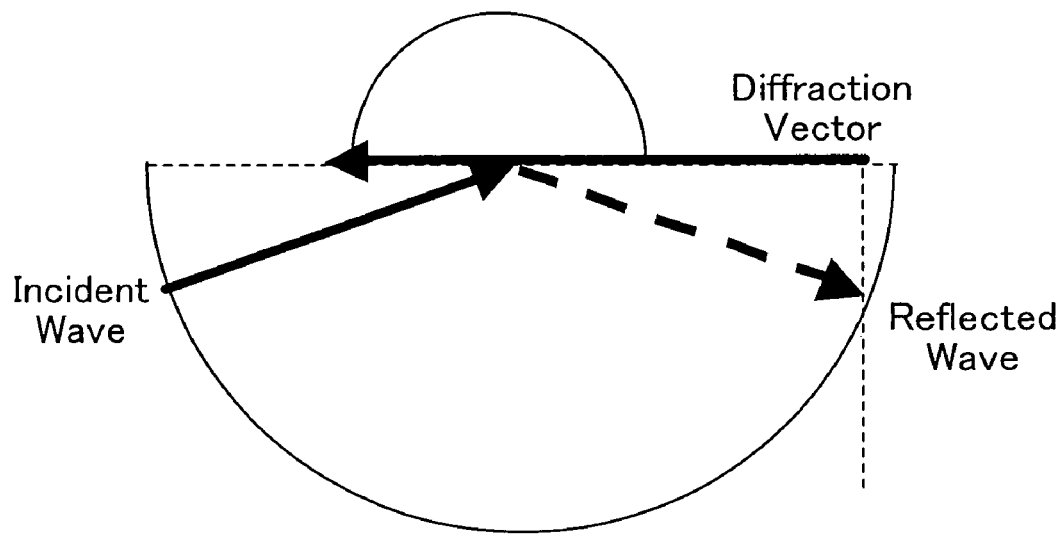

FIGS. 4A and 4B are views showing a structure of the wave-number space when a two-dimensional periodic structure with a 0.1-μm period is formed in the surface of the n-type GaN. The periodic structure formed in the surface causes diffraction so that it is necessary for a wave number $k_{1//}$ in the horizontal direction of the incident wave and a wave number $k_{2//}$ in the horizontal direction of the transmitted wave to satisfy the following condition based on Diffraction Vector G=2π/Λ (Λ is a period):

$$k_{2//}=k_{1//}\pm mG \text{ (m is an order of diffraction and m=0, } \pm 1, \pm 2, \ldots ).$$

The transmitted wave occurs when the wave number $k_{2//}$ which satisfies the foregoing expression and the condition for the equi-frequency surface mentioned above exists.

As shown in FIG. 4A, when the period of the structure is 0.1 μm and the incident angle is zero degree, the magnitude of the diffraction vector is excessively large so that, if it is assumed that the transmitted wave is diffracted, total reflection occurs since $k_{2//}$ is larger than the equi-frequency surface in the air. In this case, therefore, no diffraction occurs. When the incident angle is 70 degrees at which a 0-order transmitted wave is totally reflected, as shown in FIG. 4B, the condition for total reflection is satisfied even if the light is diffracted. In the case with the period, therefore, total reflection occurs at an incident angle not less than the total reflection critical angle in the same manner as when the surface is flat.

Figure 5:
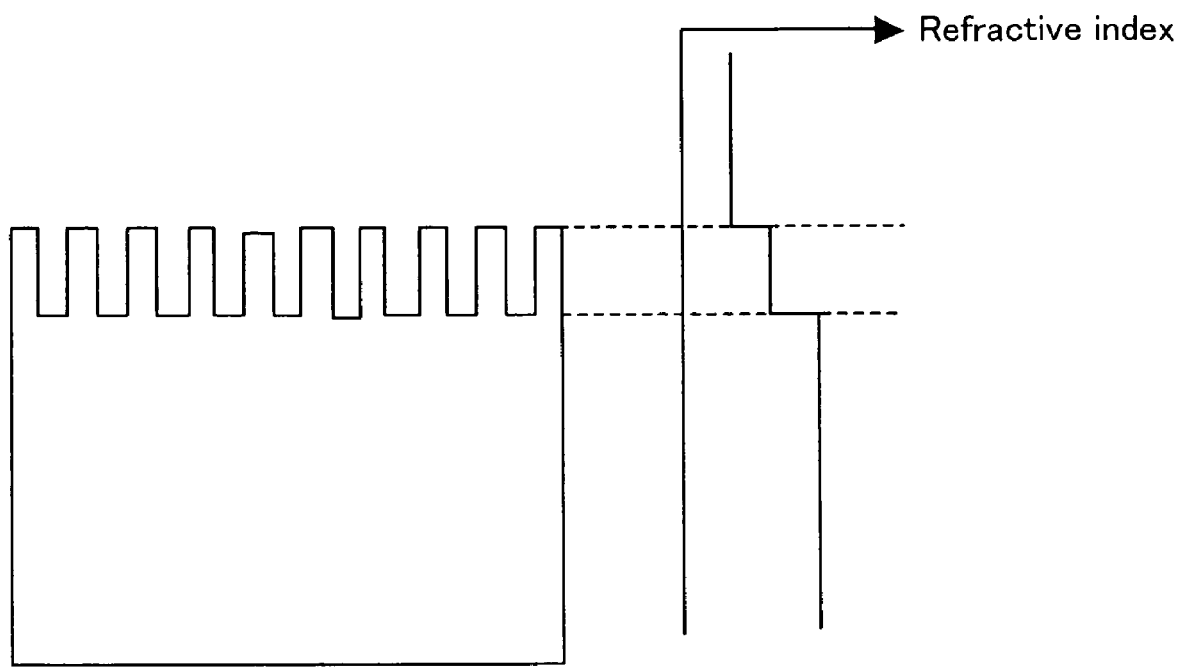
FIG. 5 is a view showing a refractive index at each portion of a semiconductor layer having a surface formed with a periodic structure.

FIG. 5 is a view showing a refractive index at each portion of a semiconductor layer having a surface formed with the periodic structure. As shown in FIG. 5, when the period of the periodic structure is smaller than the wavelength of light, the effective refractive index of the two-dimensional periodic structure in the surface of the semiconductor layer lowers due to the projections/depressions thereof so that the two-dimensional periodic structure functions as a layer having a refractive index in the middle of the refractivities of the air and the LED. In this case, the refractive index difference between the air and the LED is reduced so that it becomes possible to suppress Fresnel reflection which occurs when the incident angle is smaller than the total reflection critical angle and improve the transmittance of light when the incident angle is smaller than the total reflection critical angle, as shown in FIG. 2.

Figure 6A:
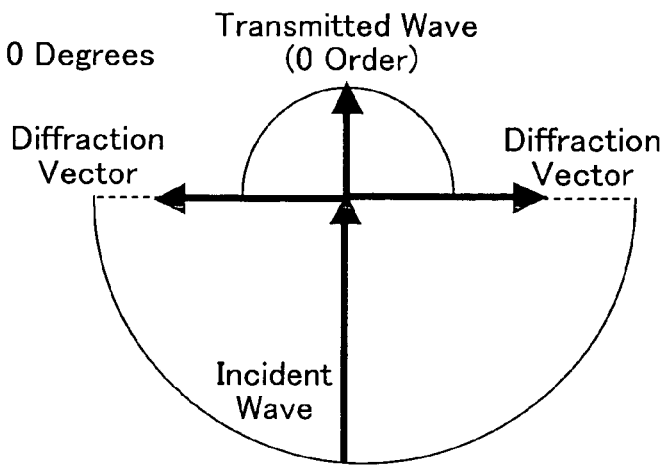
FIGS. 6A to 6C are views each showing a structure of the wave-number space when a two-dimensional periodic structure with a 0.2-μm period has been formed on the surface of the n-type GaN layer.
Figure 6B:
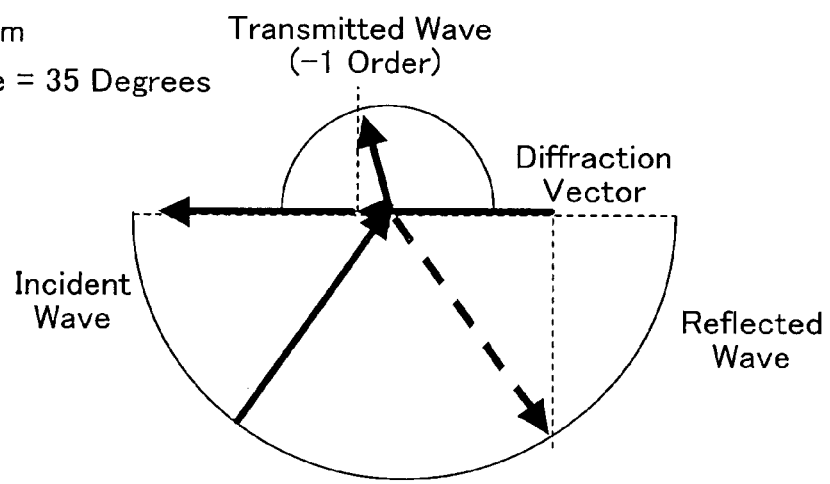
Figure 6C:
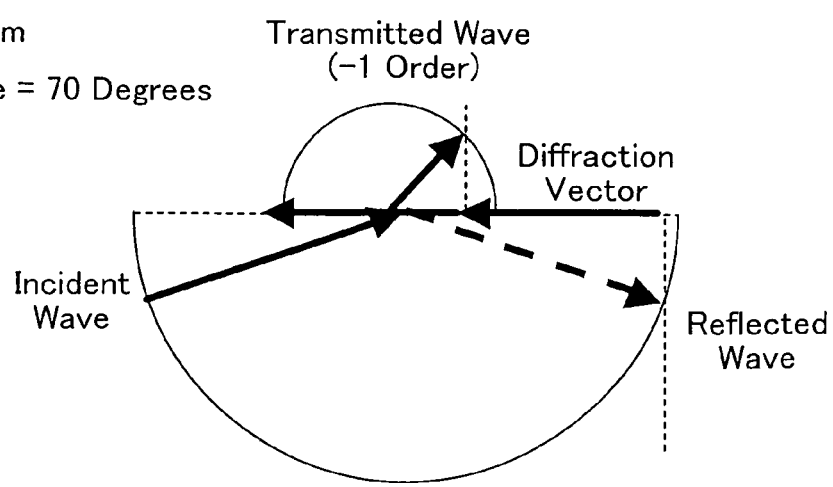

A description will be given next to the case where the surface (back surface) of the n-type GaN layer has a two-dimensional periodic structure with a 0.2-μm period. FIGS. 6A to 6C are views showing a structure of the wave-number space when the two-dimensional periodic structure with a 0.2-μm period has been formed in the surface of the n-type GaN layer.

Under this condition, total reflection occurs since $k_{2//}$ when light is diffracted is larger than the equi-frequency surface in the air provided that the incident angle of the light is zero degree so that no diffraction occurs. In this case, a 0-order transmitted wave passes through the interface between the n-type GaN layer and the air.

By contrast, when the surface is flat and the incident angle at which total reflection occurs is 30 degrees or 70 degrees, $k_{2//}$ is smaller than the equi-frequency surface in the air so that the diffracted transmitted wave (the order of diffraction: −1) is allowed to pass through the interface, as shown in FIGS. 6B and 6C. As a result, the transmittance does not become zero even at an angle not less than the total reflection critical angle, as shown in FIG. 2. Since the diffraction efficiency also contributes to an actual transmittance, the transmittance presents a complicated curve. In this case, the diffraction vector is relatively large so that diffraction of an order not lower than second does not contribute to transmission.

Figure 7A:
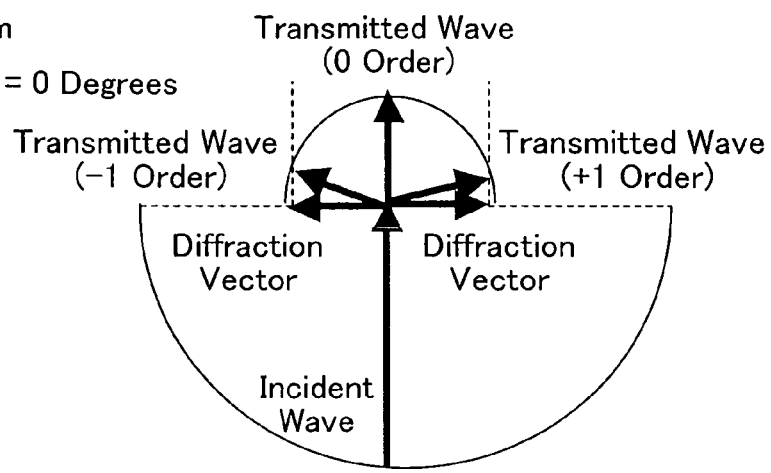
FIG. 7 is a view showing a structure of the wave-number space when a two-dimensional periodic structure with a 0.4-μm period has been formed in the surface of the n-type GaN layer.
Figure 7B:
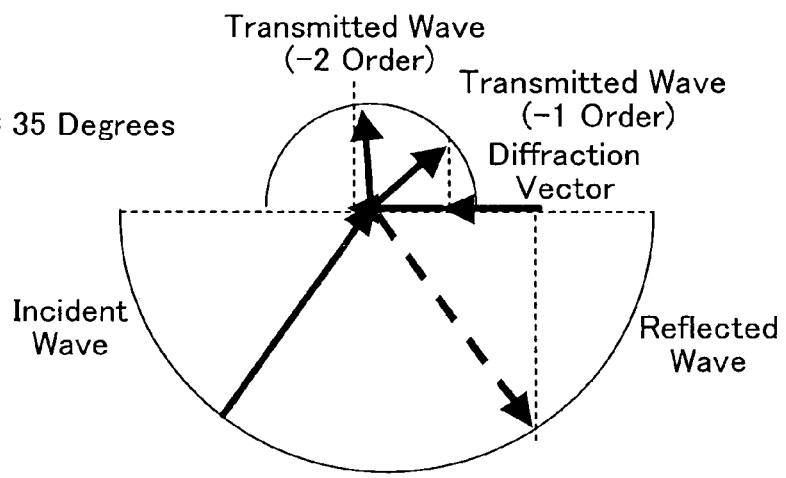
Figure 7C:
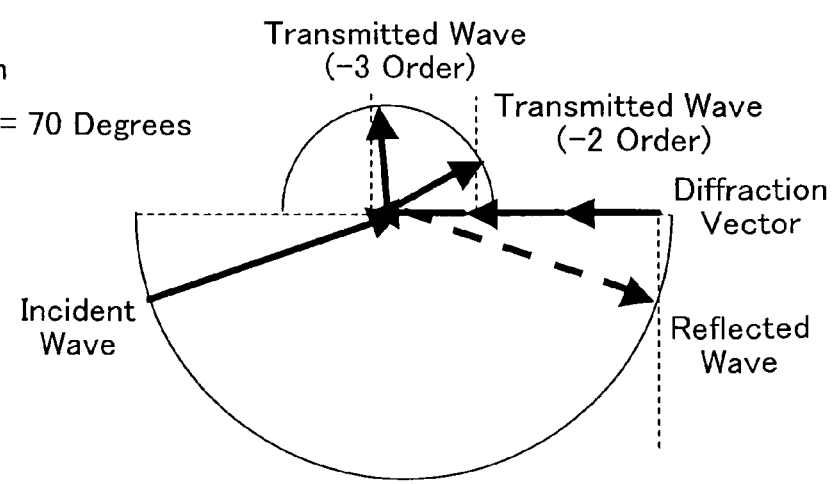

FIG. 7 is a view showing a structure of the wave-number space when a two-dimensional periodic structure with a 0.4-μm period has been formed in the surface of the n-type GaN layer. Since the diffraction vector is relatively small with this period, first-order diffraction is related to transmission even when the incident angle of light is zero degree as shown in FIG. 7A. When the incident angle is 35 degrees as shown in FIG. 7B, first- and second-order diffraction contributes to transmission, while second- and third-order diffraction contributes to transmission when the incident angle is 70 degrees as shown in FIG. 7C. As a result, the transmittance becomes relatively high even at an angle not less than the total reflection critical angle, as shown in FIG. 2.

Thus, as the period of the structure formed in the surface of the n-type GaN layer becomes larger, higher-order diffraction is involved and the behavior of light becomes more complicated.

Based on the result of the foregoing analysis, it is assumed that, in the semiconductor light emitting element according to the present embodiment, $0.5\lambda/N<\Lambda<20\lambda/N$ is satisfied when the refractive index of the semiconductor layer formed with the two-dimensional periodic structure is N and the period of the two-dimensional periodic structure is Λ. If $0.5\lambda/N>\Lambda$ is satisfied, an angle change caused by diffraction is large and the diffracted light is at an angle over the total reflection critical angle so that the diffracted light is not emitted to the outside of the semiconductor light emitting element. In this case, diffraction with a two-dimensional period cannot improve the light extraction efficiency. If $\Lambda>20\lambda/N$ is satisfied, the period becomes extremely larger than the wavelength of light emitted from the active layer so that the effect of diffraction is hardly expected. In view of the foregoing, the condition defined by $0.5\lambda/N<\Lambda<20\lambda/N$ is preferably satisfied to validate the effect of the two-dimensional periodic structure.

Figure 8:
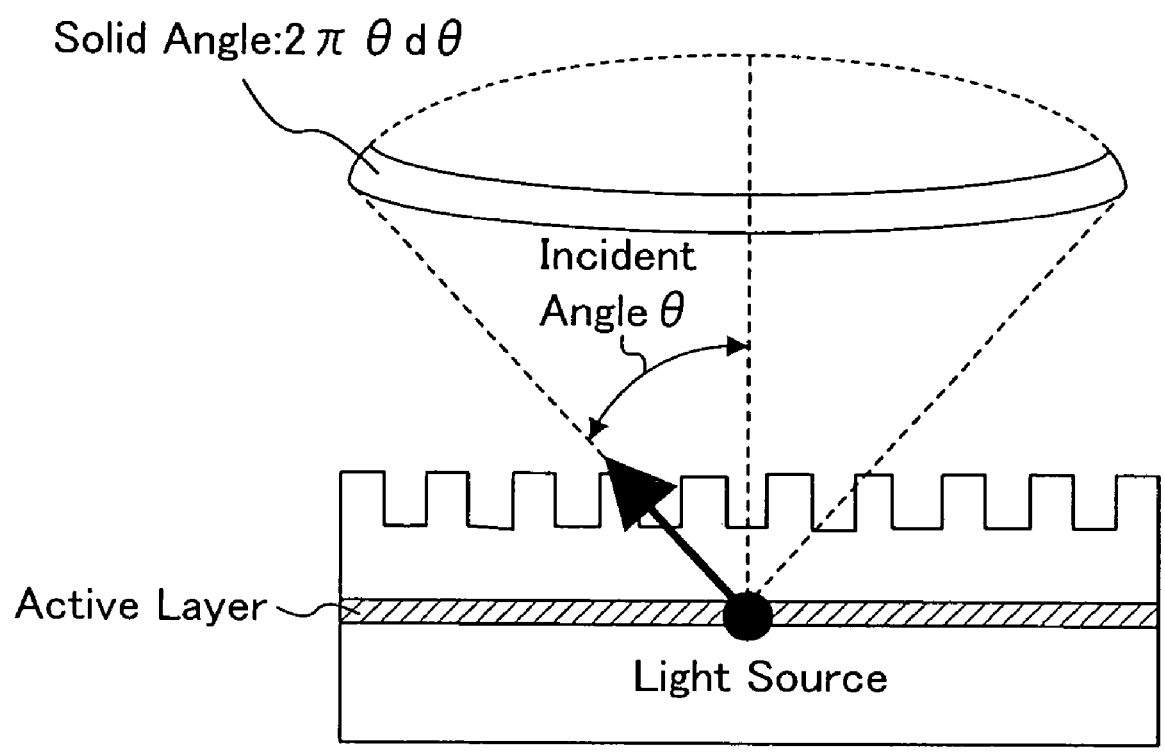
FIG. 8 is a view for illustrating a solid angle used to calculate light extraction efficiency.

FIG. 8 is a view for illustrating a solid angle used to calculate light extraction efficiency. As shown in the drawing, it is necessary to obtain actual light extraction efficiency η by integrating a theoretical reflectivity with an incident angle in consideration of the effect of a solid angle on a transmittance T (θ) at each incident angle. Specifically, η can be derived from the following numerical expression:

$$\eta=\int 2\pi T(\theta)\cdot\theta\cdot d\theta.$$

Figure 9:
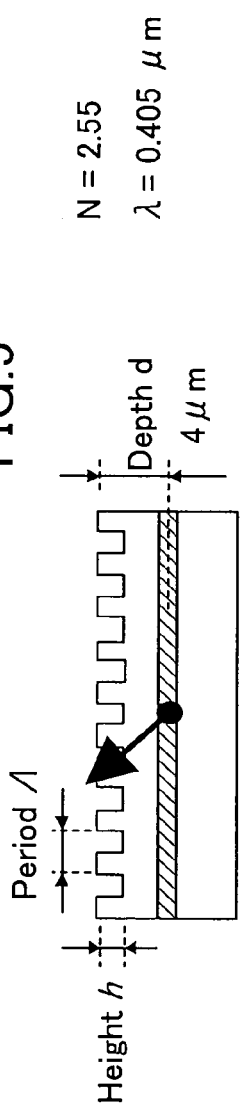
FIG. 9 is a view showing a value obtained by normalizing light extraction efficiency obtained by using numerical calculation to light extraction efficiency when the surface of the n-type GaN layer is flat.
Figure 9:
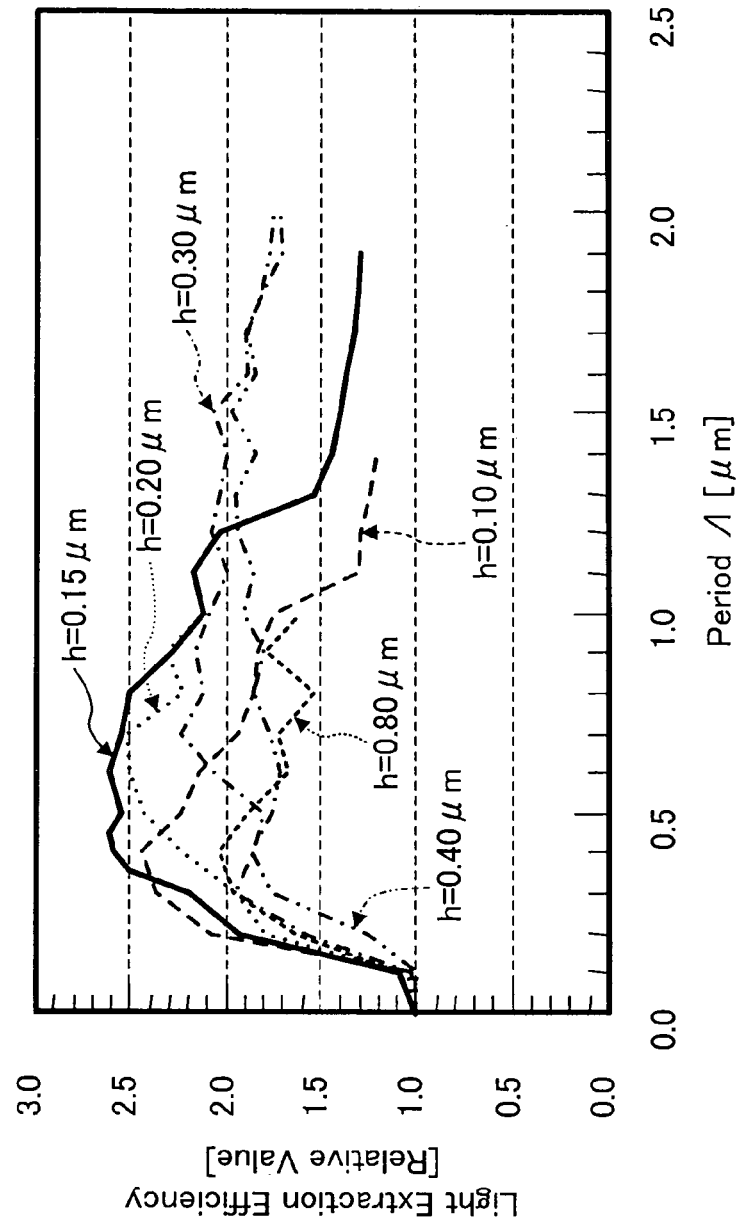

FIG. 9 is a view showing a value obtained by normalizing light extraction efficiency obtained from the foregoing numerical expression to light extraction efficiency when the surface of the n-type GaN layer is flat. As the parameters of calculation, the period Λ and the height h of each of the projections/depressions are considered. According to the result, the light extraction efficiency is maximum when the height of each of the projections in the surface of the GaN layer is 150 nm. This is because, when the height h of each of the projections/depressions is $\lambda/\{2(n_2-n_1)\}$ (where λ is a light emission wavelength in an air or in vacuum, $n_1$ is the refractive index of the air, and $n_2$ is the refractive index of a semiconductor), the phase of the light component of light passing through the projections/depressions which passes through each of the projections and the phase of the light component thereof which passes through each of the depressions intensify each other through interference so that the diffraction effect achieved by the projections/depression becomes maximum. In this case, h=about 130 nm is satisfied, which nearly coincides with the result of numerical calculation in accordance with the FDTD method. Thus, in the semiconductor light emitting element according to the present embodiment, h is most preferably in the vicinity of an integral multiple of $\lambda/\{2(n_2-n_1)\}$. It is assumed herein that h approximates to $\lambda/\{2(n_2-n_1)\}$ by considering general performance variations resulting from the fabrication process.

It can be seen from FIG. 9 that, when the height h of each of the projections/depression is 150 nm, the light extraction efficiency is improved by 2.6 times at the maximum compared with the case where the surface of the n-type GaN layer is flat provided that period $\Lambda$ is 0.4 to 0.5 µm. To circumvent total reflection, it is necessary to use higher-order diffraction as the period $\Lambda$ is longer. However, since the diffraction efficiency becomes lower as the order of diffraction is higher, the light extraction efficiency becomes lower as the period is longer when the period $\Lambda$ is in the range not less than 0.4 µm. For example, when the period of the structure shown in FIG. 2 is 2.0 µm, the transmittance of light at an incident angle not smaller than the total reflection critical angle is lower than that with a 0.4-µm period.

Figure 10A:
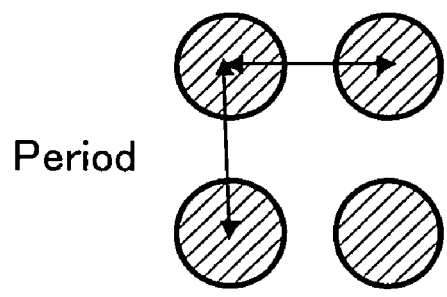
FIGS. 10A and 10B are plan views each showing the arrangement of a two-dimensional periodic structure formed in the surface of the n-type GaN layer.
Figure 10B:
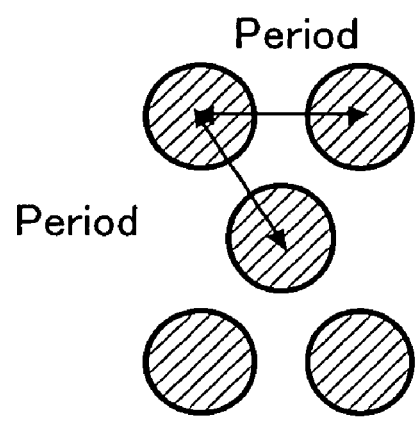

FIGS. 10A and 10B are plan views showing the arrangement of the two-dimensional periodic structure formed in the surface of the n-type GaN layer. As shown in the drawings, the two-dimensional periodic structure formed in the semiconductor light emitting element according to the present embodiment may be either a tetragonal lattice or a triangular lattice.

Method for Fabricating Light Emitting Element

FIGS. 11A to 11F are perspective views illustrating a method for fabricating the semiconductor light emitting element according to the present embodiment which is shown in FIG. 1.

Figure 11A:
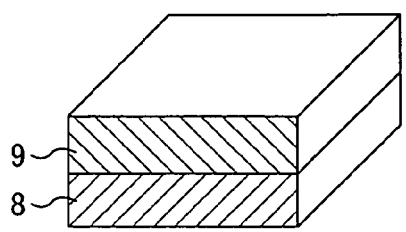
FIGS. 11A to 11F are perspective views illustrating a method for fabricating the semiconductor light emitting element according to the first embodiment.

First, as shown in FIG. 11A, the sapphire substrate 8 is prepared and the AlGaN layer 9 with a thickness of 1 µm is formed through crystal growth by MOCVD (Metal Organic Chemical Vapor Deposition) on the principal surface of the sapphire substrate 8. If the thickness of the AlGaN layer 9 is 1 µm, crystal defects occurring therein are reduced. The composition of Al in the AlGaN layer 9 is assumed herein to be 100%, though the AlGaN layer 9 may have any Al composition provided that it is transparent to the wavelength of light used for a laser lift-off process performed later.

Figure 11B:
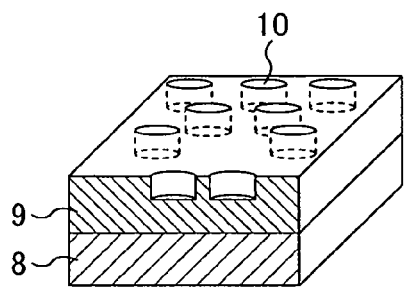

Next, as shown in FIG. 11B, the depressed-type two-dimensional periodic structure 10 is formed in the principal surface of the AlGaN layer through patterning. In the present step, a resist for an etching mask is patterned by using electron beam exposure, a stepper, and the like. Then, the etching of the AlGaN layer can be performed by using a dry etching technology such as RIE (Reactive Ion Etching) or ion milling, by photoelectrochemical etching under the irradiation of ultraviolet light, or by using a wet etching technology such as etching using a heated acid/alkali solution for the etching of the nitride-based compound semiconductor. In this example, the two-dimensional periodic structure 10 is formed by electron beam exposure and RIE. It is assumed that the period of the two-dimensional periodic structure 10 is 0.4 µm and the depth of each of the depressions is 150 nm. Although the configuration of the two-dimensional periodic structure 10 is not particularly limited, the depression has a cylindrical hole in the example shown in FIG. 11B.

Figure 11C:
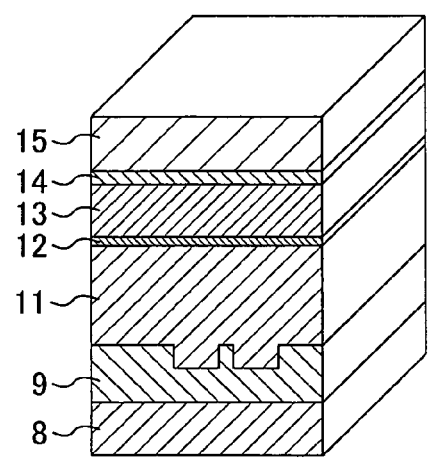

Next, as shown in FIG. 11C, an n-type GaN layer 11 (corresponding to the n-type GaN layer 5 in FIG. 1), a non-doped InGaN active layer 12 (corresponding to the non-doped InGaN active layer 4), a p-type GaN layer 13 (corresponding to the p-type GaN layer 3) are formed in this order by MOCVD on the principal surface of the AlGaN layer 9 formed with the two-dimensional periodic structure 10. It is assumed herein that the respective thicknesses of the n-type GaN layer 11, the non-doped InGaN active layer 12, and the p-type GaN layer 13 are 0.4 µm, 3 nm, and 200 nm. In the present step, the crystal growth of the n-type GaN layer 11 is performed by setting conditions for the growth such that the two-dimensional periodic structure 10 is filled therewith.

Thereafter, the Pt/Au high-reflection p electrode 2 (composed of a multilayer film of Pt and Au) is formed on the principal surface of the p-type GaN layer 13 by, e.g., electron beam vapor deposition. Further, the Au plating layer 15 with a thickness of about 50 µm is formed by using the Au layer of the high-reflection p electrode 2 as an underlying electrode.

Figure 11D:
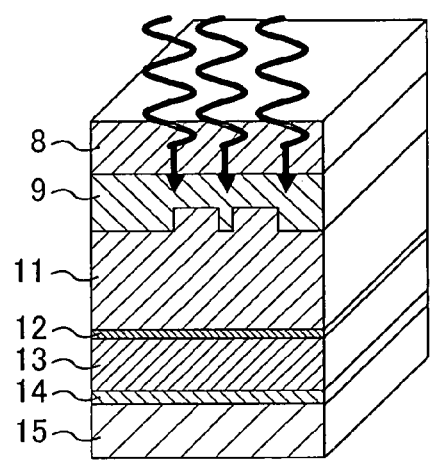

Subsequently, as shown in FIG. 11D, a KrF excimer laser (at a wavelength of 248 nm) is applied to the back surface of the sapphire substrate 8 for its irradiation in such a manner as to scan the surface of a wafer. The laser beam used for irradiation is not absorbed by the sapphire substrate 8 and the AlGaN layer 9 but is absorbed only by the n-type GaN layer 11 so that GaN is unbonded by local heat generation in the vicinity of the interface with the AlGaN layer 9. As a result, it becomes possible to separate the AlGaN layer 9 and the sapphire substrate 8 from the n-type GaN layer 11 and a device structure made of a GaN-based semiconductor is obtainable. The light source used herein may be any light source provided that it supplies light at a wavelength absorbed by the GaN layer and transparent to the AlGaN layer and the sapphire layer. It is also possible to use a third harmonic (at a wavelength of 355 nm) of a YAG laser or an emission line of a mercury lamp (at a wavelength of 365 nm).

Figure 11E:
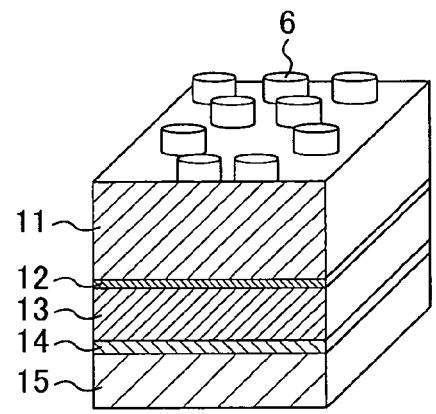

Next, as shown in FIG. 11E, the sapphire substrate 8 and the AlGaN layer 9 are removed from the state shown in FIG. 11D. As a result, the projecting-type two-dimensional periodic structure 6 is formed by self alignment in the back surface of the n-type GaN layer. Since such a semiconductor multilayer film (i.e., a multilayer film composed of the n-type GaN layer 11, the non-doped InGaN active layer 12, and the p-type GaN layer 13) resulting from the removal of the substrate is an extremely thin film with a thickness of about 5 µm, it has been difficult to form an extremely fine structure such as a photonic crystal by using a conventional photolithographic technology. However, the method according to the present invention allows easy transfer of the extremely fine structure to the surface (back surface) of the semiconductor multilayer film by merely depositing a semiconductor multilayer film over the depressed two-dimensional periodic structure 10 formed preliminarily in the substrate and removing the substrate thereafter.

Figure 11F:
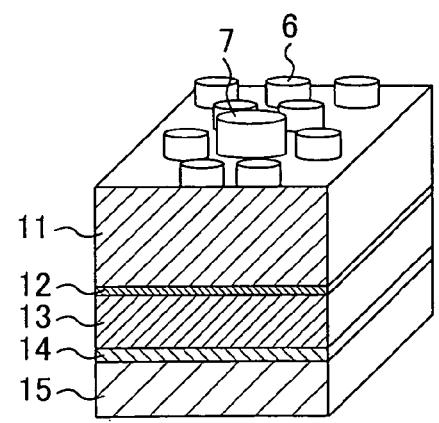

Then, as shown in FIG. 11F, the Ti/Al n electrode 7 having a thickness of 1 µm is formed on the region of the back surface of the n-type GaN layer 11 in which the two-dimensional periodic structure 6 is not formed by vapor deposition and lithography or the like, whereby the semiconductor light emitting element according to the present embodiment is fabricated.

Effects of Semiconductor Light Emitting Element and Fabrication Method Therefor

Figure 12A:
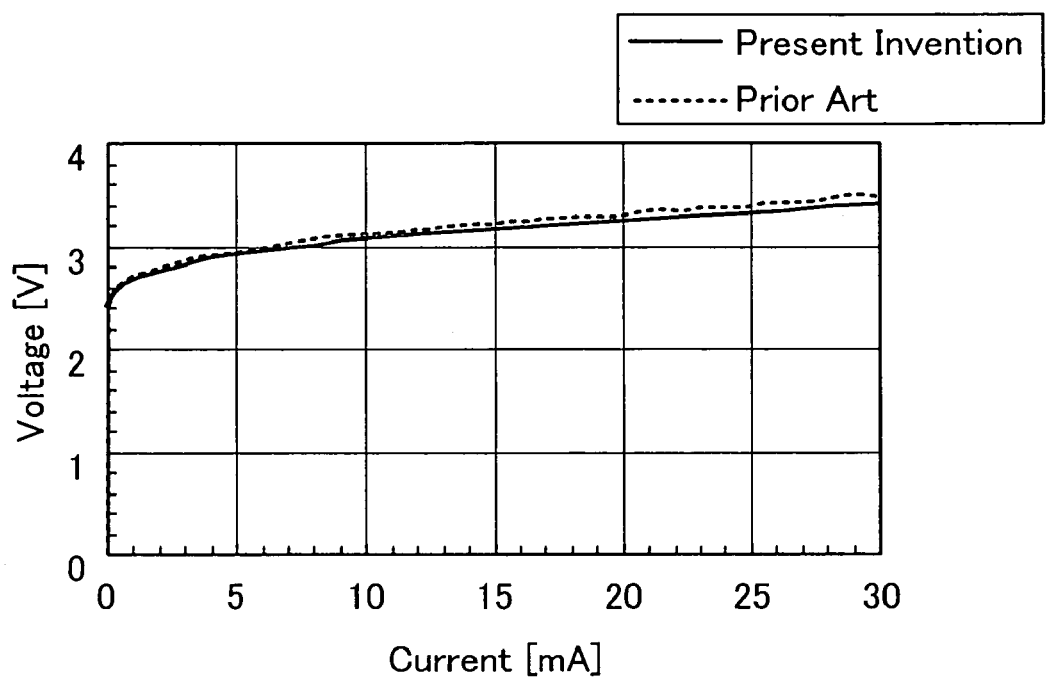
FIG. 12A is a view showing the respective current-voltage characteristics of a conventional semiconductor light emitting element and the semiconductor light emitting element according to the first embodiment and FIG. 12B is a view showing the respective current-light output characteristics of the conventional semiconductor light emitting element and the semiconductor light emitting element according to the first embodiment.
Figure 12B:
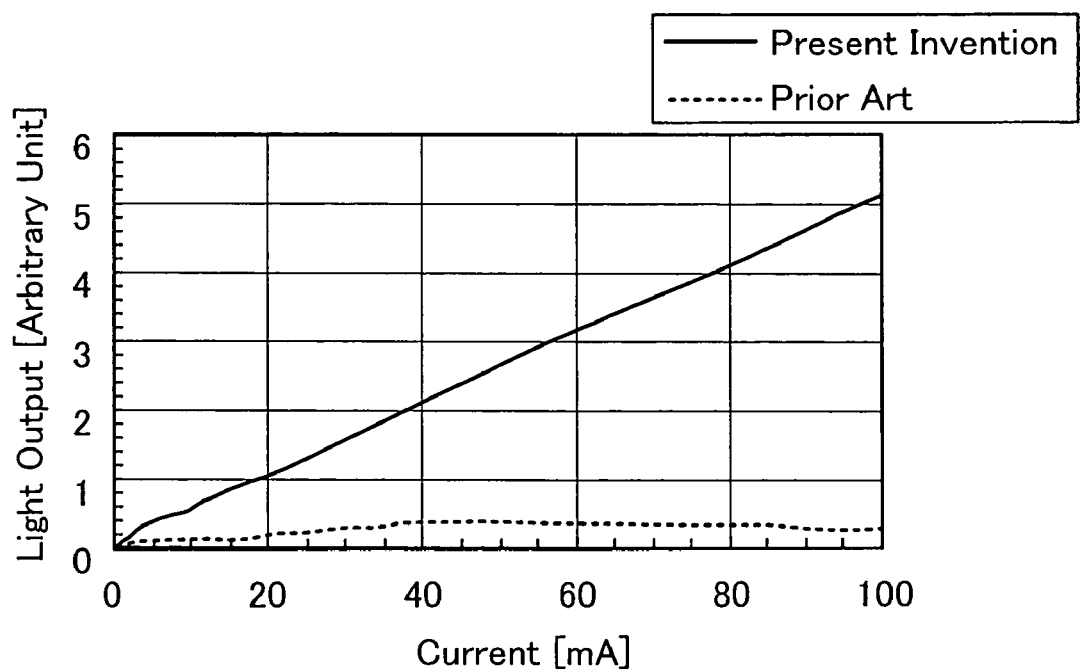

FIG. 12 show the characteristics of the semiconductor light emitting element thus obtained, of which FIG. 12A is a view showing the respective current-voltage characteristics of the semiconductor light emitting elements according to the conventional and present embodiments and FIG. 12B is a view showing the respective current-light output characteristics of the semiconductor light emitting elements according to the conventional and present embodiments. In the drawings, the graphs of the dotted lines represent the characteristics of the semiconductor element having the conventional structure in which the surface of the LED is flat and from which the sapphire substrate has not been removed and the graphs of the solid lines represent the characteristics of the semiconductor light emitting element according to the present embodiment.

From the current-voltage characteristics shown in FIG. 12A, it will be understood that the semiconductor light emitting elements according to the present and conventional embodiments have substantially equal current-voltage characteristics including substantially the same rising voltages. From the comparison with the conventional embodiment in which the projections/depressions are not formed in the surface of the n-type GaN layer, it will be understood that, in the semiconductor light emitting element fabricated by the method according to the present embodiment, the semiconductor multilayer film receives no processing-induced damage resulting from the formation of the two-dimensional periodic structure. Although the sapphire substrate 8 can be removed by polishing and the AlGaN layer 9 can be removed by etching in the substrate separating step shown in FIGS. 10D and 11E, a method which uses a laser is more preferable because it is completed in a shorter period of time.

From the current-light output characteristic shown in FIG. 12B, on the other hand, it will be understood that, under the same current, the light output of the semiconductor light emitting element according to the present embodiment has increased to a value substantially five times the light output of the semiconductor light emitting element according to the conventional embodiment. The value is about double the theoretically calculated value shown in FIG. 2. This is because, due to the two-dimensional periodic structure in the surface of the LED, the efficiency of light extraction from the surface has increased to about 2.5 times the efficiency of light extraction from the flat surface of the conventional LED and, in addition, the high-reflection p electrode 14 formed on the lower surface of the LED (the back surface of the p-type GaN layer 13) allows the light emitted from the non-doped InGaN active layer 12 toward the high-reflection p electrode 14 to be reflected efficiently to the two-dimensional periodic structure 6.

From FIG. 12B, it will also be understood that the light output of the conventional structure is saturated under a large current, while the light output of the element according to the present embodiment is not saturated even under a large current over 100 mA. This is because heat generated in the active layer of the conventional structure is dissipated through the n-type semiconductor layer as thick as several micrometers and through the sapphire substrate with a poor heat conduction property. This is also because the light emitting element according to the present embodiment has an excellent heat dissipation property because heat from the active layer can be dissipated from the p-type semiconductor as thin as submicron meters through the Au plating layer with a high thermal conductivity.

Thus, even under a large current, the Au plating layer 15 allows the retention of the improved light extraction efficiency achieved by the two-dimensional periodic structure 6.

FIGS. 13A and 13B, FIG. 14, and FIGS. 15A and 15B are perspective views showing variations of the semiconductor light emitting element according to the present embodiment. FIGS. 16A and 16B are perspective views each showing a variation of the method for fabricating the semiconductor light emitting element according to the present embodiment.

Figure 13A:
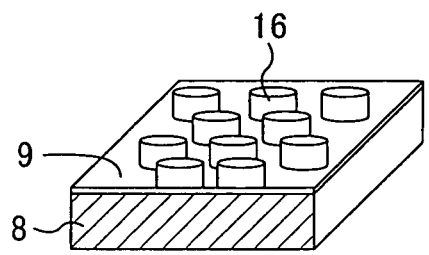
FIGS. 13A and 13B are perspective views each showing a variation of the semiconductor light emitting element according to the first embodiment.
Figure 13B:
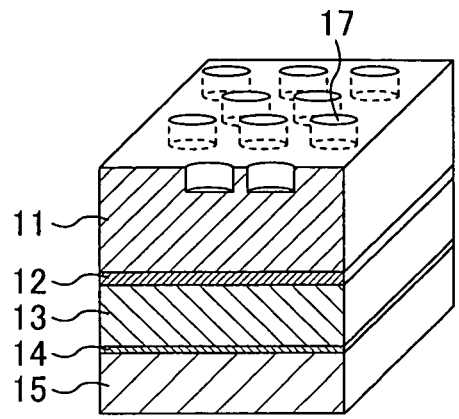

Although the projecting-type two-dimensional periodic structure 6 has been formed by using the depressed-type two-dimensional periodic structure 10 formed in the surface of the AlGaN layer 9 on the sapphire substrate 8 as a "mold" in the semiconductor light emitting element according to the present embodiment, the same effects are also achievable by forming the projecting-type two-dimensional periodic structure 16 in the surface of the AlGaN layer 9 and thereby forming a depressed-type two dimensional periodic structure 17 in the surface of the LED, as shown in FIGS. 13A and 13B. That is, the incident light can be diffracted provided that the two-dimensional periodic structure has been formed whether the structure in the surface of the LED is of the projecting type or the depressed type.

Figure 14:
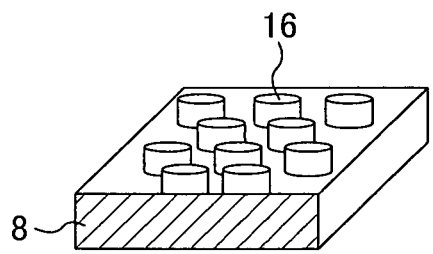
FIG. 14 is a perspective view showing a variation of the semiconductor light emitting element according to the first embodiment.

Besides the method which forms the projections/depressions in the AlGaN layer 9, a method as shown in FIG. 14 which forms the projecting or depressed two-dimensional periodic structure 16 in the principal surface of the sapphire substrate 8 also allows the implementation of a semiconductor light emitting element in which the projecting-type or depressed-type two-dimensional periodic structure is formed in the surface of the AlGaN layer 9 by using the projecting or depressed two-dimensional periodic structure 16 as a mold.

Figure 15A:
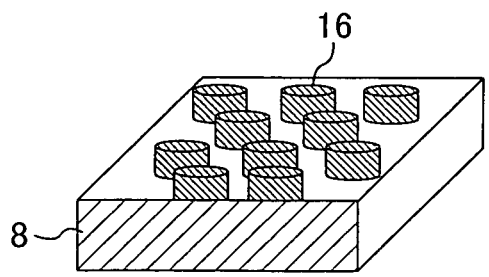
FIGS. 15A and 15B are perspective views each showing a variation of the semiconductor light emitting element according to the first embodiment.
Figure 15B:
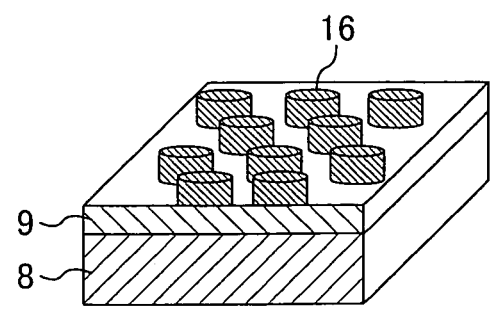
Figure 16A:
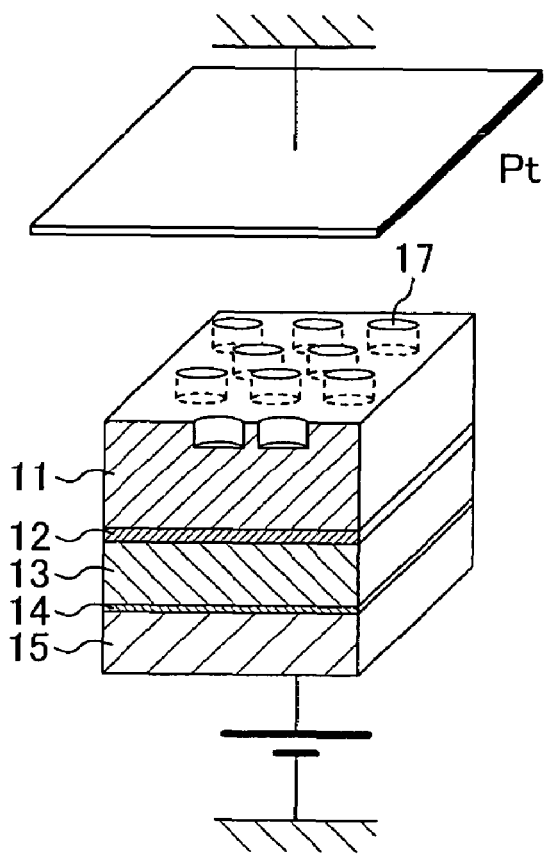
FIGS. 16A and 16B are perspective views each showing a variation of the semiconductor light emitting element according to the first embodiment.
Figure 16B:
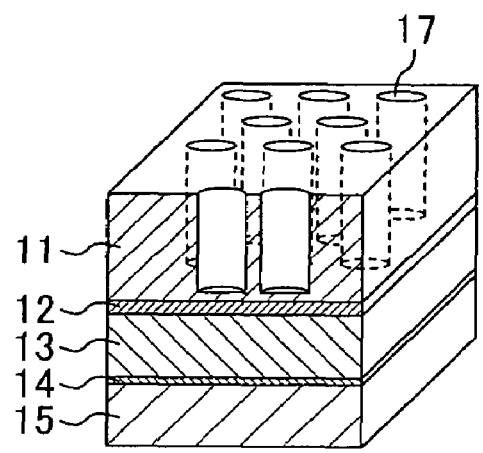

Alternatively, as shown in FIG. 15A, it is also possible to form the projecting-type two-dimensional periodic structure 16 structure by forming an oxide film such as a $SiO_2$ film, a nitride film such as a SiN film, or a metal film such as a tungsten (W) film on the sapphire substrate 8 and then patterning the formed film. As shown in FIG. 15B, a light emitting element having the same characteristics as the semiconductor light emitting element according to the present embodiment can also be fabricated by forming the projecting two-dimensional periodic structure 16 composed of an oxide film, a nitride film, or a metal film in the principal surface of the AlGaN layer 9.

If a SiC substrate is used in place of the sapphire substrate, the substrate can be removed by selective dry etching performed with respect to SiC and GaN. If a Si substrate is used, the substrate can easily be removed by wet etching.

In the case where the depressed two-dimensional periodic structure 17 formed in the back surface (upper surface) of the n-type GaN layer 11 through the removal of the substrate has a small depth or the inclination of the inner tilted surface of each of the depressions is not perpendicular, the configuration of the depression can be adjusted by performing processes as shown in FIGS. 16A and 16B after the removal of the substrate.

Specifically, as shown in FIG. 16A, an LED structure and a counter electrode made of Pt or the like are immersed in an electrolytic solution such as an aqueous KOH solution and a voltage is applied between the LED and the counter electrode by using the p side of the LED as a positive electrode. Consequently, anodic oxidation causes the etching of GaN, as shown in FIG. 16B, but only the depression is etched due to the localization of an electric field so that the depth of the depression is increased successfully. The localization of the electric field to the depression also causes the etching resulting from the anodic oxidation to proceed perpendicularly. As a result, the depression having a perpendicular tilted surface can be formed by the etching resulting from the anodic oxidation even when the inner tilted surface of the depression after the removal of the substrate is not vertical.

Figure 17:
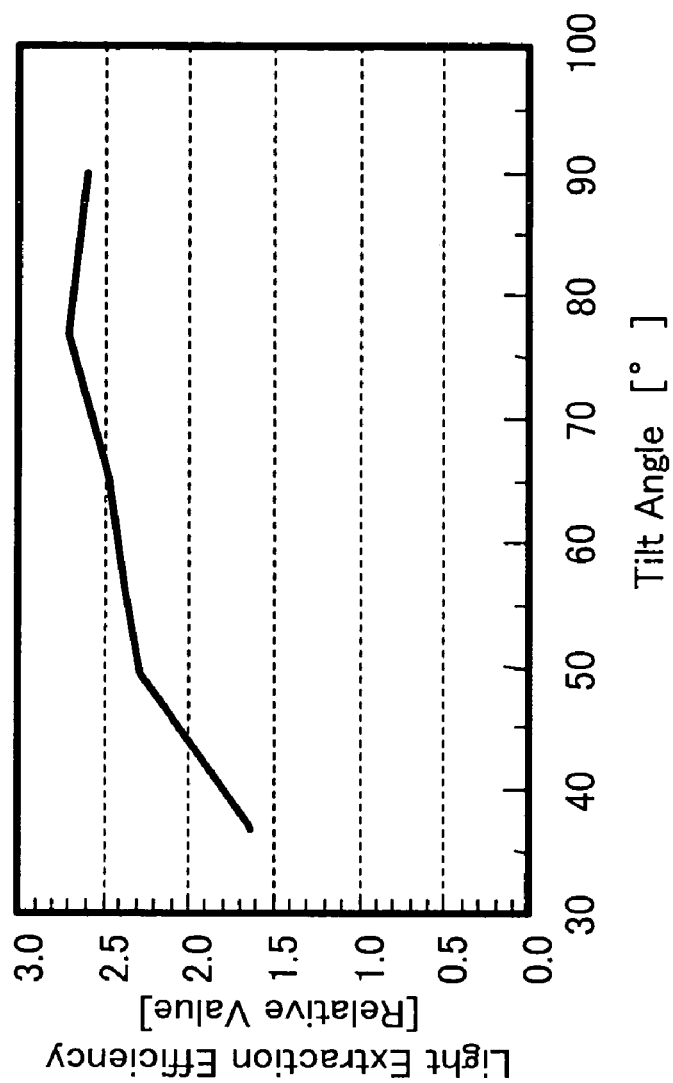
FIG. 17 is a view showing the result of theoretically calculating the dependence of light extraction efficiency on the tilt angle of a depression.
Figure 17:
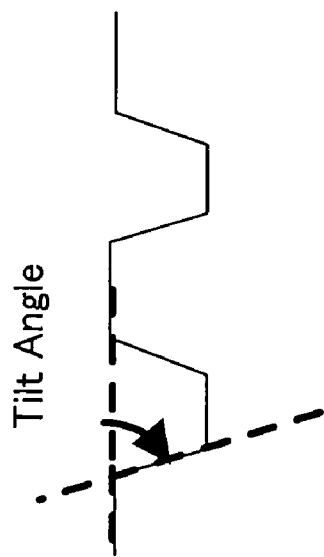

FIG. 17 is a view showing the result of theoretically calculating the dependence of the light extraction efficiency on the tilt angle of the depression. It is assumed herein that the tilt angle is obtained by subtracting, from 180 degrees, the angle formed between the side surface of the depression and the upper surface of the n-type GaN layer 11 in a vertical cross section, as shown in the left part of the drawing. From the result shown in FIG. 17, it will be understood that the light extraction efficiency lowers abruptly when the tilt angle becomes 50 degrees or less. That is, when the tilt angle of the two-dimensional periodic structure that can be formed after the removal of the substrate is small, the tilt angle can be increased by the anodic oxidation etching described above and the high light extraction efficiency can be implemented. Thus, in the semiconductor light emitting element according to the present embodiment, the tilt angle of the two-dimensional periodic structure is adjusted preferably to 50 degrees or more. Even when the two-dimensional periodic structure has a projecting configuration, the tilt angle is preferably 50 degrees or more in terms of improving the light extraction efficiency.

Embodiment 2

Figure 18A:
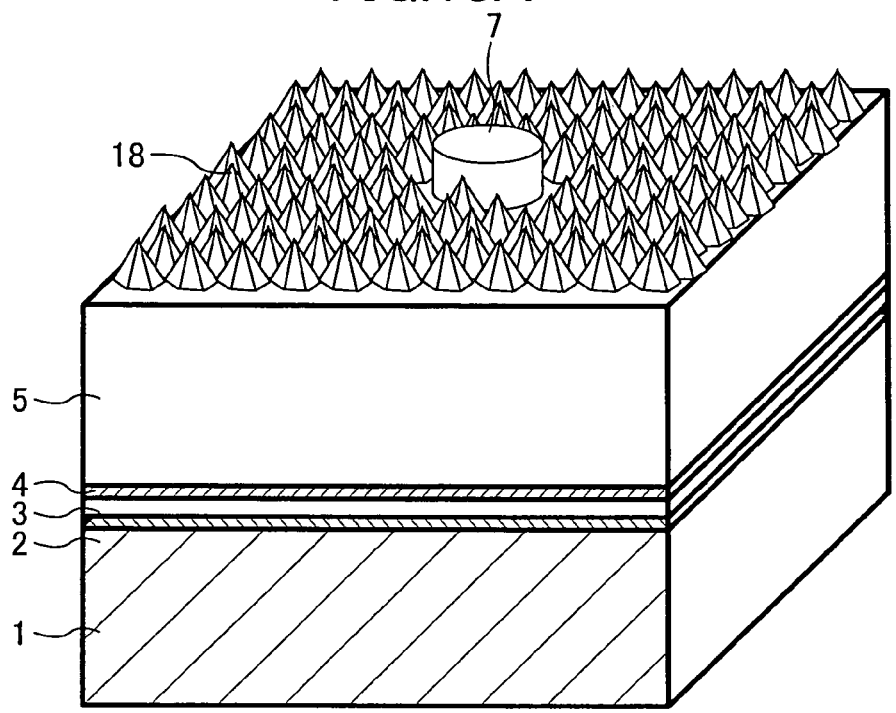
FIG. 18A is a perspective view showing a semiconductor light emitting element according to a second embodiment of the present invention and FIG. 18B is a plan view when the semiconductor light emitting element according to the second embodiment is viewed from above.
Figure 18B:
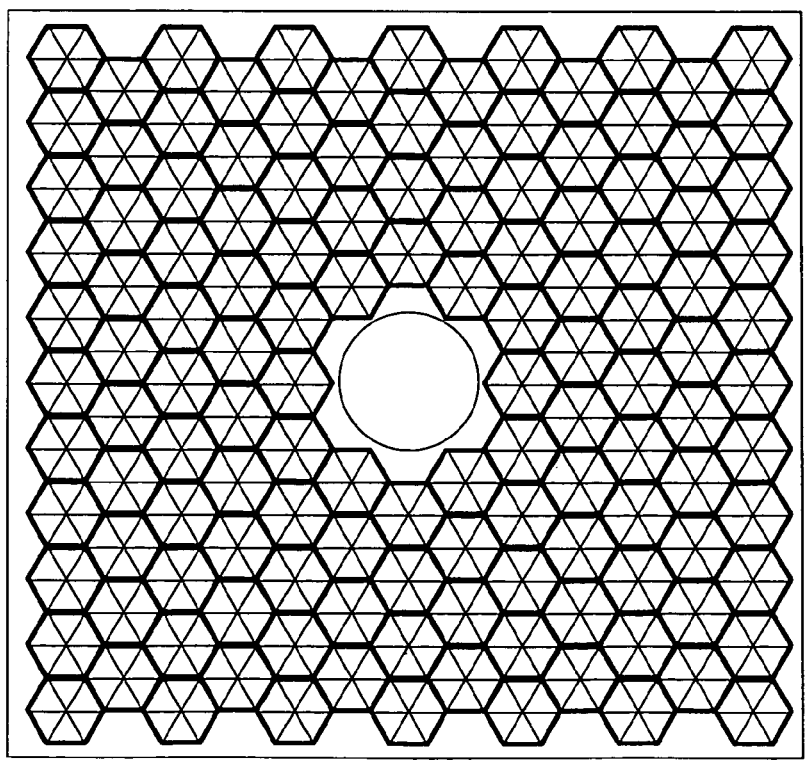

FIG. 18A is a perspective view showing a semiconductor light emitting element according to a second embodiment of the present invention. FIG. 18B is a plan view when the semiconductor light emitting element according to the second embodiment is viewed from above. The semiconductor light emitting element according to the present embodiment is different from the semiconductor light emitting element according to the first embodiment in that a projecting two-dimensional periodic structure 18 formed in the upper surface (back surface) of the n-type GaN layer 5 is configured as polygonal pyramids.

As shown in FIGS. 18A and 18B, the semiconductor light emitting element according to the present embodiment comprises: the p-type GaN layer 3 formed by epitaxial growth and having a thickness of 200 nm; the high-reflection p electrode 2 formed on the crystal growing surface of the p-type GaN layer 3, made of platinum (Pt) and gold (Au) which are stacked in layers, and having a thickness of 1 µm; the Au plating layer 1 formed on the lower surface of the high-reflection p electrode 2 and having a thickness of 10 µm; the non-doped InGaN active layer 4 formed on the back surface of the p-type GaN layer 3 and having a thickness of 3 nm; the n-type GaN layer 5 formed on the back surface of the non-doped InGaN active layer 4, having a back surface formed with a two-dimensional periodic structure 18 composed of projections each configured as a hexagonal pyramid, and having a thickness of 4 µm; and the n electrode 7 formed on the back surface of the n-type GaN layer 5, made of titanium (Ti) and Al which are stacked in layers, and having a thickness of 1 µm. In the same manner as in the first embodiment, the PL peak wavelength of the non-doped InGaN active layer 4 is 405 nm. The side surface of the projecting structure in the back surface of the n-type GaN layer 5 is composed of the {10-1-1} plane of GaN. The period of the two-dimensional periodic structure 18, i.e., the spacing between the respective centers of the adjacent projections in a two-dimensional plane is 1.0 µm and the height of each of the projections is 950 nm.

Figure 19A:
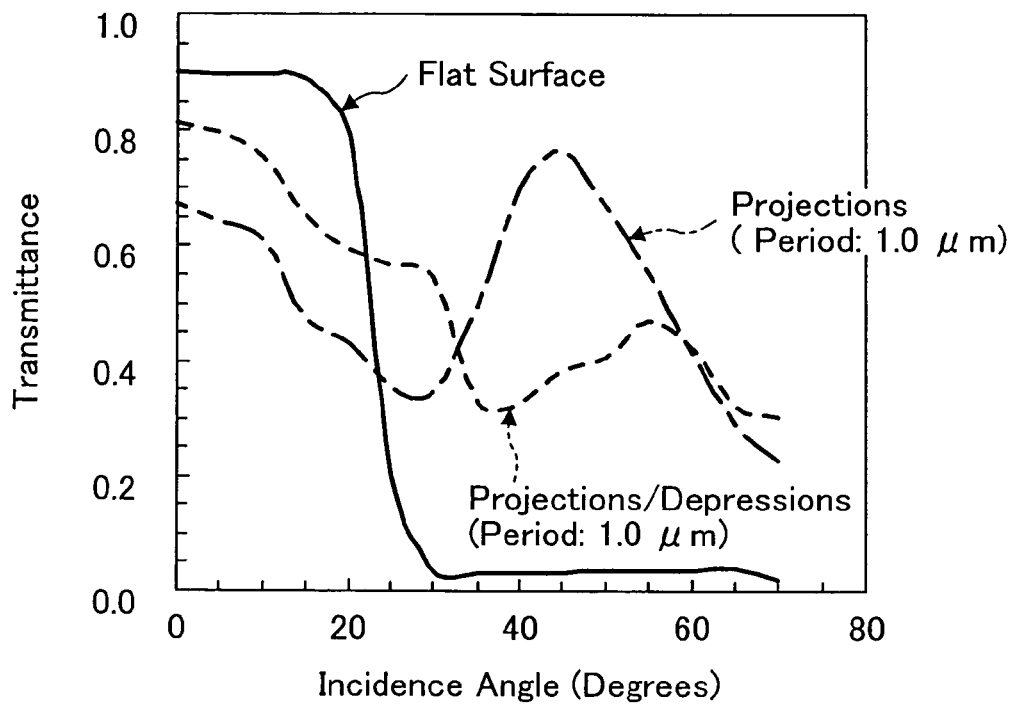
FIG. 19A is a view showing the result of theoretically calculating the transmittance T of light incident on the surface of an n-type GaN layer when the surface (back surface) of the n-type GaN layer is formed with projections configured as hexagonal pyramids and FIG. 19B is a view showing the relationship between the period of a two-dimensional periodic structure and light extraction efficiency.
Figure 19B:
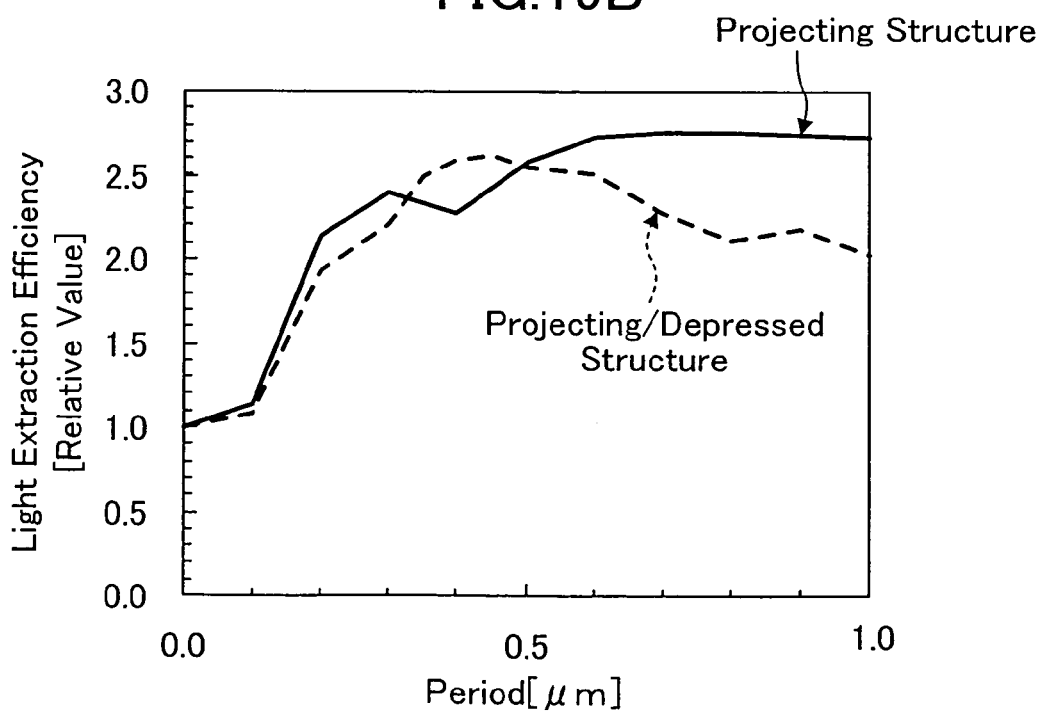

FIG. 19A is a view showing the result of theoretically calculating the transmittance T of light emitted from the active layer and incident on the surface of the n-type GaN layer when the projections each configured as the hexagonal pyramid are formed in the surface (back surface) of the n-type GaN layer. FIG. 19B is a view showing the relationship between the period of the two-dimensional periodic structure and the light extraction efficiency. FIG. 19B assumes 1 when the surface of the n-type GaN layer is flat and shows, for comparison, the cases where the two-dimensional periodic structure has a projecting configuration and a projecting/depressed configuration (the same configuration as shown in the first embodiment).

From the result shown in FIG. 19A, it will be understood that, even when the period of the two-dimensional periodic structure is as long as 1.0 µm, the projecting structure shows a high transmittance at an incident angle in the vicinity of 45 degrees. Thus, in the semiconductor light emitting element according to the present embodiment in which the cross section of the two-dimensional periodic structure is configured as a triangular waveform, the angle between the tilted surface of the two-dimensional periodic structure and the incident light approaches 90 degrees when the angle of light emitted from the active layer and incident upon the two-dimensional periodic structure in the surface of the semiconductor light emitting element is large so that the diffraction efficiency is increased. Since the light at a large incident angle accounts for a large proportion in the light emitted from the active layer, high light extraction efficiency is achieved.

From the result shown in FIG. 19B, it will be understood that the projecting structure shows the same high light emission efficiency as achieved by the projecting/depressed structure and particularly retains the effect of increasing the light extraction efficiency even with a longer period. It is to be noted that, with a period of 1.0 µm, the light extraction efficiency obtained from the surface formed with the two-dimensional periodic structure increases to 2.7 times the original light extraction efficiency.

A description will be given next to a method for fabricating the semiconductor light emitting element according to the present embodiment.

FIGS. 20A to 20F are perspective views illustrating the method for fabricating the semiconductor light emitting element according to the present embodiment. In the fabrication method according to the present embodiment, the steps shown in FIGS. 20A to 20E are substantially the same as those in the fabrication method according to the first embodiment shown in FIG. 11 so that the description thereof will be omitted. However, it is assumed that the period of the depressed-type two-dimensional periodic structure 10 formed in the principal surface of the AlGaN layer 9 is 1.0 µm and the depth of the depression is 150 nm.

Figure 20A:
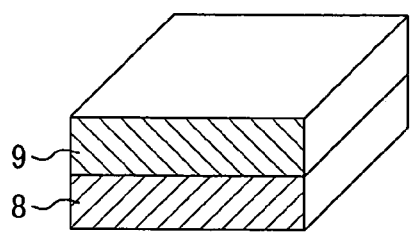
FIGS. 20A to 20F are perspective views illustrating a method for fabricating the semiconductor light emitting element according to the second embodiment.
Figure 20B:
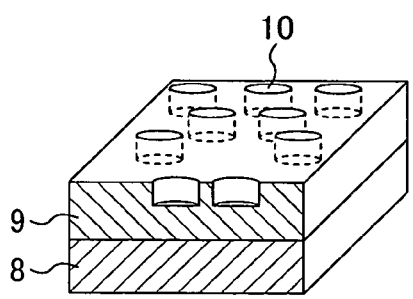
Figure 20C:
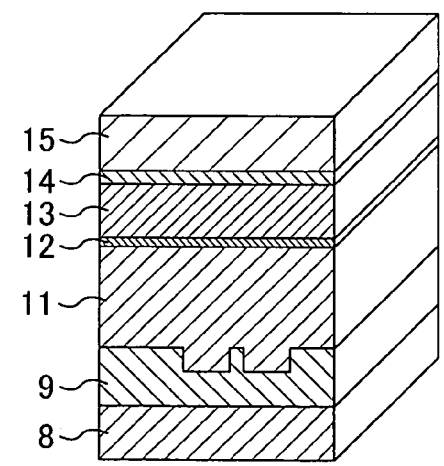
Figure 20D:
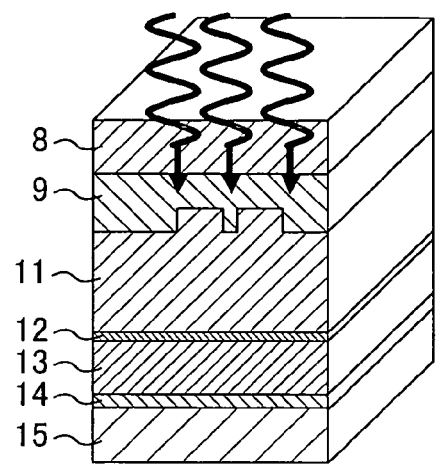
Figure 20E:
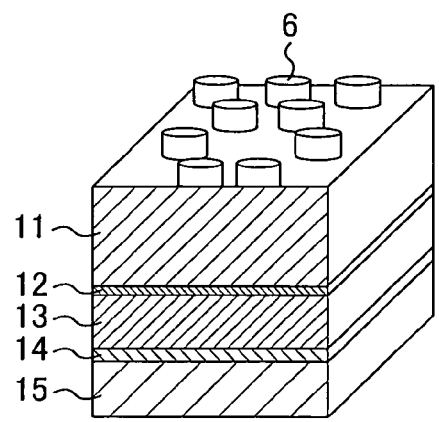

That is, in the fabrication method according to the present embodiment, the sapphire substrate 8 is removed from the main body of the light emitting element in the steps prior to and inclusive of that shown in FIG. 20E so that the two-dimensional periodic structure 6 composed of, e.g., cylindrical projections is formed by self alignment on the back surface of the n-type GaN layer 11.

Figure 20F:
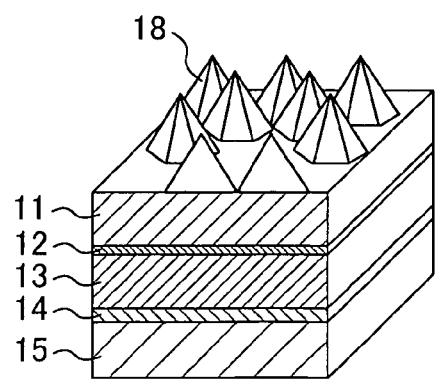

Next, in the step shown in FIG. 20F, wet etching using an aqueous KOH solution is performed with respect to the n-type GaN layer 11 formed with the projecting-type two-dimensional periodic structure 6. It is well known that, in an etching process using KOH, an etching speed has different conditions depending on crystal planes. Under such conditions, the projecting-type two-dimensional periodic structure 6 described above is changed by etching to the two-dimensional periodic structure 18 of a hexagonal pyramid type as shown in FIG. 20F. In the embodiment shown herein, etching is performed by using an aqueous KOH solution at a concentration of 0.1 M to form the two-dimensional periodic structure 18 composed of hexagonal pyramids each using the crystal plane {10-1-1} as a tilted surface. The fabrication method is characterized in that, since the specified crystal plane is used as the tilted surface, the two-dimensional periodic structure having a triangular cross section can be formed easily with high reproducibility.

In the semiconductor light emitting element according to the present embodiment, the light extraction efficiency is improved to about double the result of the theoretical calculation shown in FIG. 19B (about 5.3 times the light extraction efficiency achieved in the conventional embodiment) since, compared with the case where the surface of the n-type GaN layer is flat, reflection from the high-reflection p electrode 2 can also be used. In addition, heat generated in the active layer can be dissipated through the p-type GaN layer 13 which is as thin as submicron meters and through the Au plating layer 15 having a high thermal conductivity. Accordingly, the effect of improving the light extraction efficiency achieved by the two-dimensional periodic structure is also retained even when a large current of 100 mA flows in the semiconductor light emitting element according to the present embodiment. Although the high-reflection p electrode 2 may also be composed of a material other than a multilayer film consisting of Pt and Au films, it is preferable in terms of practical use for the high-reflection p electrode 2 to have a reflectivity of 80% or more with respect to the peak wavelength of light generated in the active layer. Specifically, the high-reflection p electrode 2 is preferably a metal film containing at least one of an Au film, a Pt film, a Cu film, an Ag film, and a Rh film.

To retain the excellent heat dissipation property, the Au plating layer 15 preferably has a thickness of 10 μm or more. As the material of the Au plating layer 15, Au is most preferable but a metal such as Cu or Ag can also be used because of the relatively high thermal conductivity thereof.

The fabrication method described above can reduce the damage to the n-type GaN layer compared with the method which forms the two-dimensional periodic structure directly by etching so that the current-voltage characteristic is substantially the same as when the two-dimensional periodic structure is not formed.

FIGS. 21A to 21C, FIGS. 22A and 22B, FIGS. 23A and 23B, FIGS. 24A and 24B, and FIGS. 25A to 25C are views showing variations of the method for fabricating the semiconductor light emitting device according to the present embodiment.

Figure 21A:
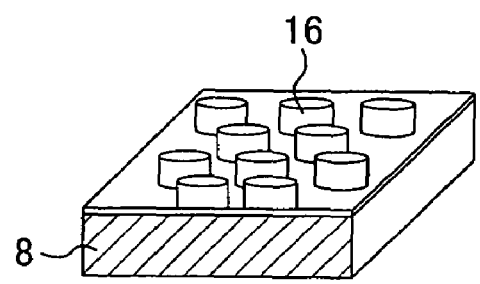
FIGS. 21A to 21C are views illustrating a variation of the method for fabricating the semiconductor light emitting element according to the second embodiment.
Figure 21B:
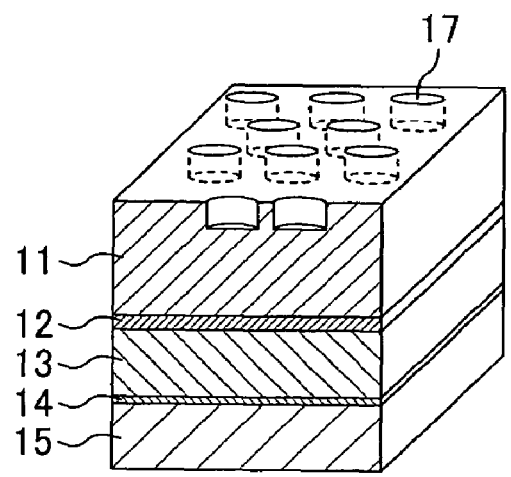
Figure 21C:
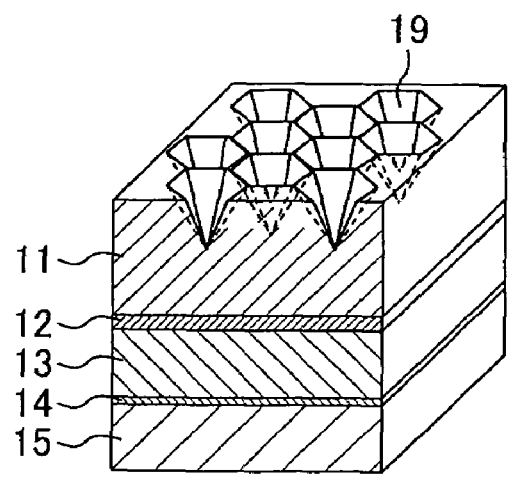
Figure 22A:
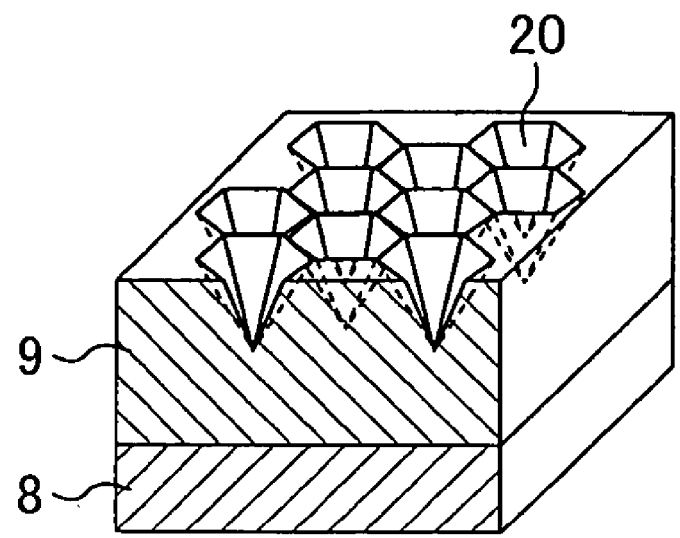
FIGS. 22A and 22B are views illustrating a variation of the method for fabricating the semiconductor light emitting element according to the second embodiment.
Figure 22B:
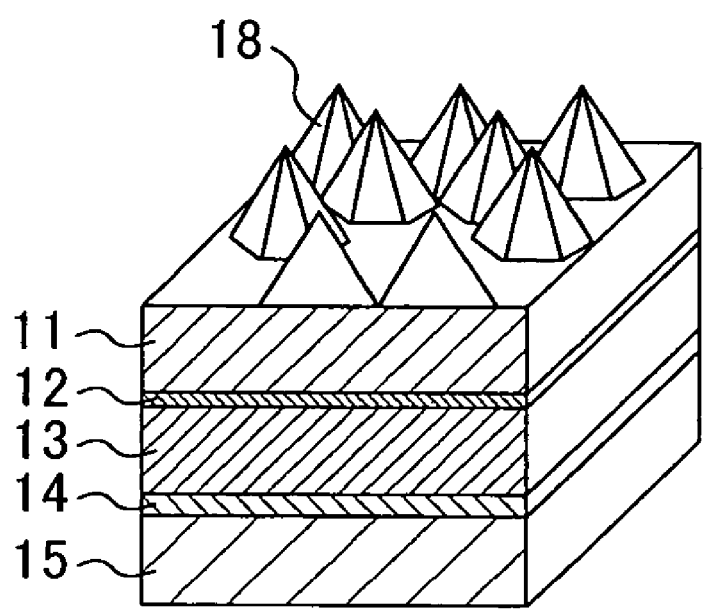
Figure 23A:
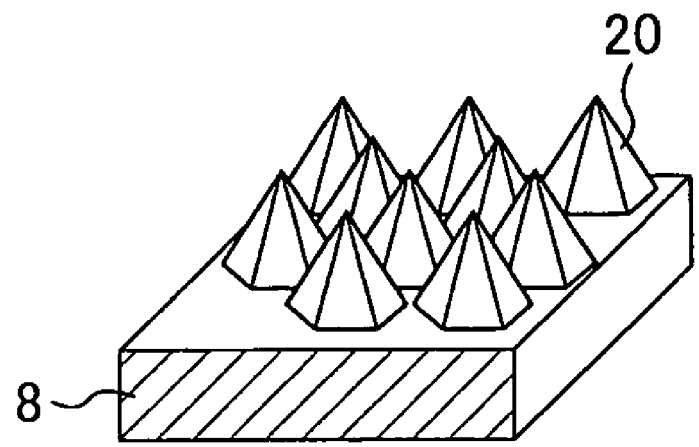
FIGS. 23A and 23B are views illustrating the variation of the method for fabricating the semiconductor light emitting element according to the second embodiment.
Figure 23B:
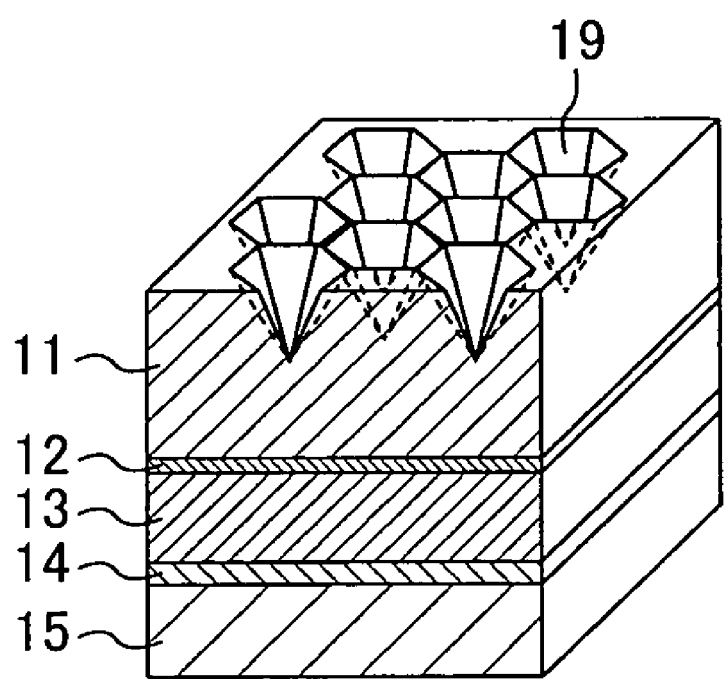

Although the fabrication method according to the present embodiment has formed the two-dimensional periodic structure having a triangular vertical cross section in the surface of the semiconductor (n-type GaN layer 11) by using the sapphire substrate 8 or the AlGaN layer 9 formed with the depressed two-dimensional periodic structure, the depressed two-dimensional periodic structure 17 may also be transferred to the semiconductor surface by using the sapphire substrate 8 or the AlGaN layer 9 formed with a projecting two-dimensional periodic structure 16 as shown in FIGS. 21A to 21C. The method allows a depressed-type two-dimensional periodic structure 19 having a triangular vertical cross section to be formed in the semiconductor surface by using the wet etching process described above. Even in the case where each of the depressions of the two-dimensional periodic structure 19 has a configuration obtained by hollowing a hexagonal pyramid, the same high light extraction efficiency as achieved by the semiconductor light emitting element according to the present embodiment is achievable.

If the two-dimensional periodic structure 20 is preliminarily formed in the surface of the AlGaN layer 9 to have a triangular vertical cross-sectional configuration as shown in FIGS. 22A and 22B and FIGS. 23A and 23B, the two-dimensional periodic structures 18 and 19 composed of projections or depressions each having a triangular vertical cross section can be formed by self alignment in the surface of the semiconductor when the sapphire substrate 8 and the AlGaN layer 9 are removed.

Figure 24A:
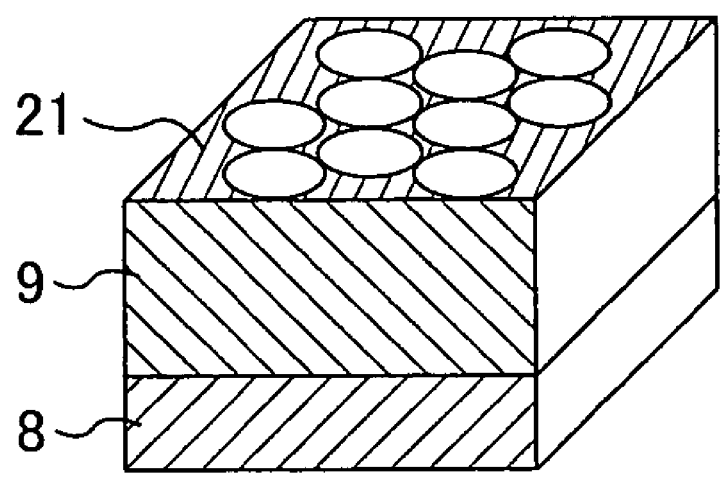
FIGS. 24A and 24B are views illustrating a variation of the method for fabricating the semiconductor light emitting element according to the second embodiment.
Figure 24B:
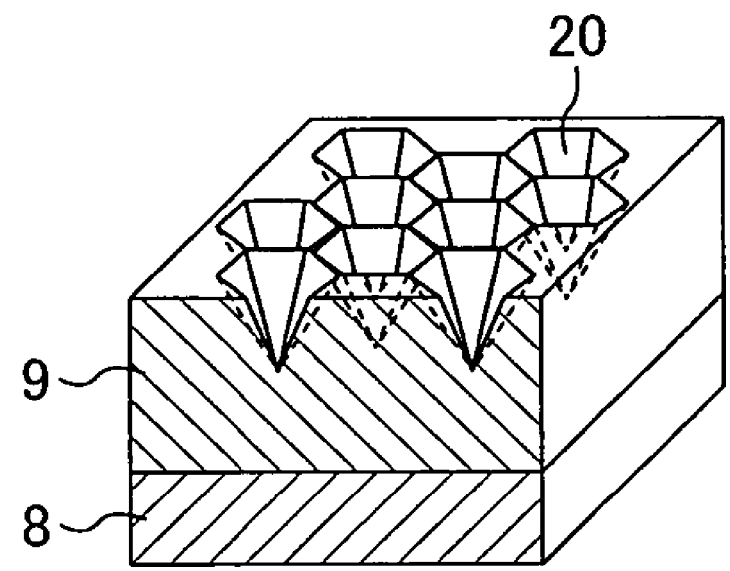

If the material of the layer in which the two-dimensional periodic structure is formed is a hexagonal system semiconductor such as AlGaN, hexagonal pyramids each having a tilted surface composed of a specific crystal plane can be formed by the same method as described above. For example, when a Ti film having an opening corresponding to a portion to be processed into a depressed configuration is formed as an etching mask 21 on the AlGaN surface, as shown in FIG. 24A, and then etching is performed using an aqueous KOH solution at 100° C., the two-dimensional periodic structure 20 is formed in the surface the AlGaN layer 9. In this case also, the two-dimensional periodic structure can be formed with high reproducibility since the tilted surface is composed of a specific crystal plane such as {10-1-1}.

Figure 25A:
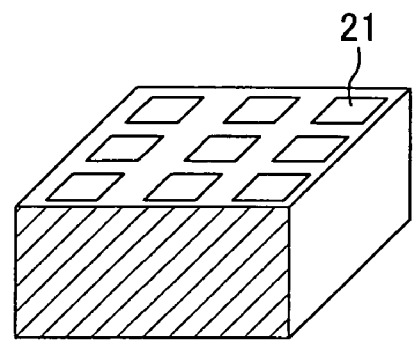
FIGS. 25A to 25C are views illustrating a variation of the method for fabricating the semiconductor light emitting element according to the second embodiment.
Figure 25B:
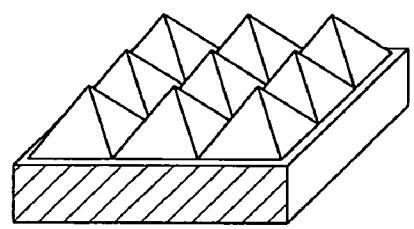
Figure 25C:
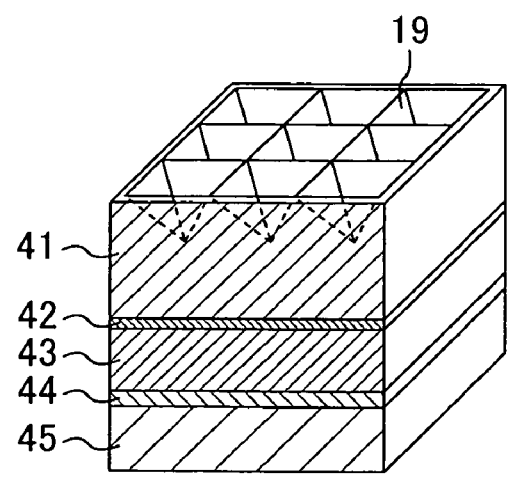

In the case where a substrate to be formed with the two-dimensional periodic structure is made of a hexagonal system semiconductor, such as a Si substrate using the (001) plane for the principal surface, the etching mask 21 made of Ti is formed into a tetragonal lattice configuration with a two-dimensional period, as shown in FIG. 25A, and then etched in an aqueous KOH solution at 70° C. This allows the two-dimensional periodic structure 20 configured as square pyramids to be formed easily in the substrate with high reproducibility, as shown in FIG. 25B, and also allows the two-dimensional periodic structure 18 composed of holes configured as square pyramids to be transferred from the substrate to the semiconductor surface, as shown in FIG. 25C.

Embodiment 3

Figure 26:
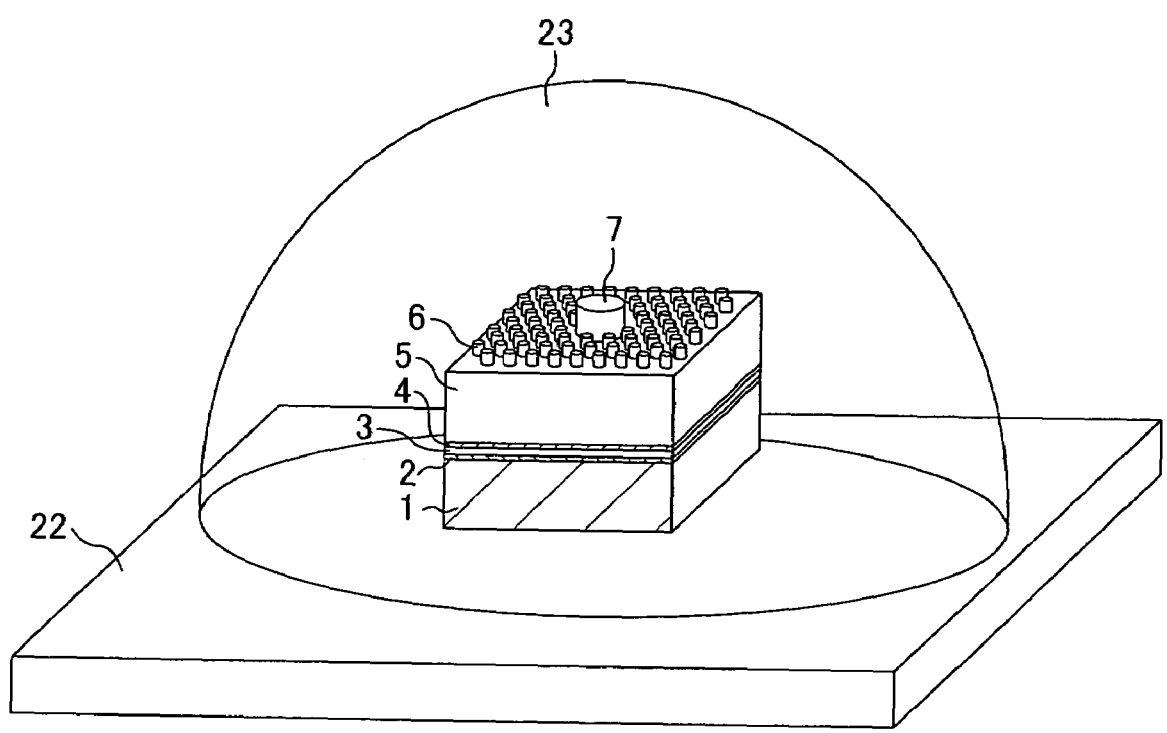
FIG. 26 is a perspective view showing a semiconductor light emitting device according to a third embodiment of the present invention.

FIG. 26 is a perspective view showing a semiconductor light emitting device according to a third embodiment of the present invention. The semiconductor light emitting device according to the present embodiment is a resin-molded semiconductor light emitting device obtained by mounting the semiconductor light emitting element according to the first or second embodiment on a mounting substrate 22 and then molding the periphery of the light emitting element with a hemispherical dome-shaped resin 23. In FIG. 26, those of the components of the semiconductor light emitting element which are the same as shown in FIG. 1 are designated by the same reference numerals.

By thus molding the light emitting element with the dome-shaped resin, the light extraction efficiency of the semiconductor light emitting element can be improved, as will be described herein below.

Figure 27A:
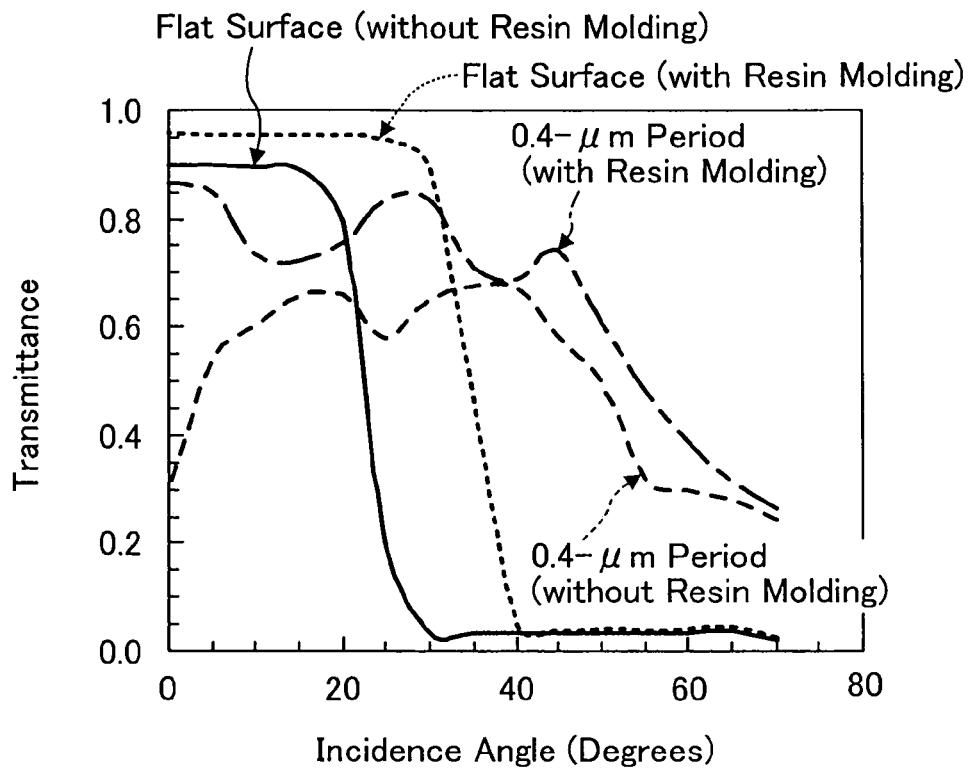
FIG. 27A is a view showing the result of theoretically calculating the transmittance of light when a semiconductor light emitting element is molded with a resin and FIG. 27B is a view showing the result of theoretically calculating the dependence of light extraction efficiency on the period of a two-dimensional periodic structure in the semiconductor light emitting element according to the third embodiment.
Figure 27B:
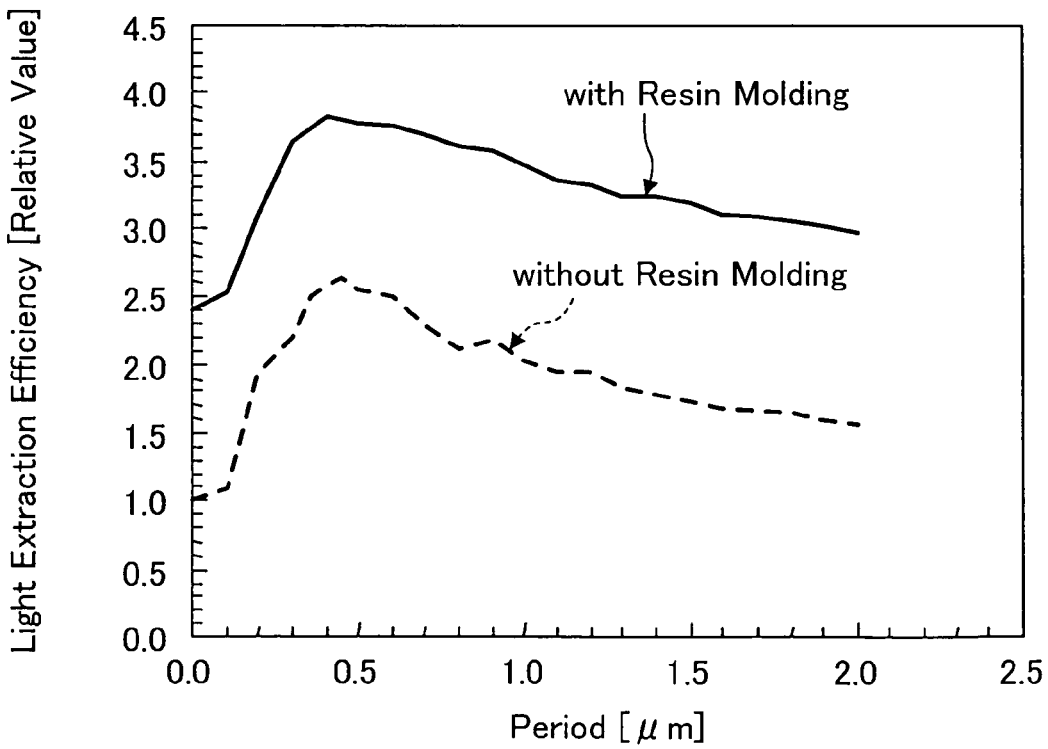

FIG. 27A is a view showing the result of theoretically calculating the transmittance of light when the semiconductor light emitting element is molded with the resin. FIG. 27B is a view showing the result of theoretically calculating the dependence of light extraction efficiency on the period of a two-dimensional periodic structure ink the semiconductor light emitting device according to the present embodiment. For comparison, FIG. 27A also shows the case where the semiconductor light emitting element is not molded with the resin and the case where the surface of the semiconductor light emitting element is flat. In the calculation the result of which is shown in the drawings, it is assumed that the refractive index of the resin is 1.5. In the calculation the result of which is shown in FIG. 27B, it is assumed that projections/depressions each having a perpendicularly tilted surface are arranged to form a two-dimensional periodic structure and the height of each of the projections is 150 nm.

From the result shown in FIG. 27A, it will be understood that, when the two-dimensional periodic structure with a 0.4-μm period is provided, the transmittance of incident light is higher at substantially every angle in the semiconductor light emitting element molded with the resin than in the semiconductor light emitting element which is not molded with the resin. Since resin molding can also increase the transmittance of light even in the semiconductor light emitting element in which the two-dimensional periodic structure is not provided, it will be understood that the transmittance of light can significantly be improved by resin molding irrespective of the period of the two-dimensional periodic structure.

The reason for the improved transmittance of light is that, even when the surface of the semiconductor light emitting element is flat, the total reflection critical angle is enlarged by resin molding and Fresnel reflection is reduced thereby even at an incident angle not more than the total reflection critical angle. In other words, the transmittance of light is improved due to a reduction in the difference between the refractive index (which is 2.5) of the inside of the semiconductor light emitting element and the refractive index (which is 1.5) of the outside thereof.

From the result shown in FIG. 27B, it will be understood that resin molding can further enhance the effect of improving the light extraction efficiency achieved by the two-dimensional periodic structure and, at the maximum, the light extraction efficiency has become 3.8 times the light extraction efficiency achieved in the conventional embodiment. This is because the molding resin is shaped like a hemispherical dome so that the light extracted from the semiconductor light emitting element into the resin is incident perpendicularly to the interface between the resin and the air due to the two-dimensional periodic structure in the surface of the semiconductor light emitting element and emitted into the air with approximately 100% efficiency. By thus molding the light emitting element formed with the two-dimensional periodic structure with the dome-shaped resin, the light extraction efficiency of the semiconductor light emitting device according to the present embodiment has been improved greatly.

In the semiconductor light emitting device according to the present embodiment, an actually measured value of the light extraction efficiency has improved to about double the result of the theoretical calculation shown in FIG. 27B (7.5 times the light extraction efficiency achieved in the conventional embodiment) since, compared with the case with the flat surface, reflection from the back surface formed with the two-dimensional periodic structure due to the high-reflection p electrode 2 can also be used. In addition, due to excellent heat dissipation from the p-type semiconductor, which is as thin as submicron meters, through the Au plating layer with a high thermal conductivity, the effect of enhancing the light extraction efficiency allows the retention of the improved light extraction efficiency achieved by the two-dimensional periodic structure even when a large current of 100 mA flows in the electrode.

A description will be given next to a method for fabricating the semiconductor light emitting device according to the present embodiment.

FIGS. 28A to 28D are perspective views illustrating the method for fabricating the semiconductor light emitting device according to the present embodiment.

Figure 28A:
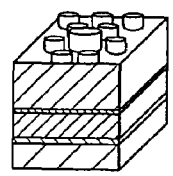
FIGS. 28A to 28D are perspective views illustrating a method for fabricating the semiconductor light emitting element according to the third embodiment.

First, as shown in FIG. 28A, the semiconductor light emitting element according to the first or second embodiment is fabricated by using the method for fabricating the semiconductor light emitting element according to the first embodiment shown in FIG. 11 or the method for fabricating the semiconductor light emitting element according to the second embodiment shown in FIG. 12.

Figure 28C:
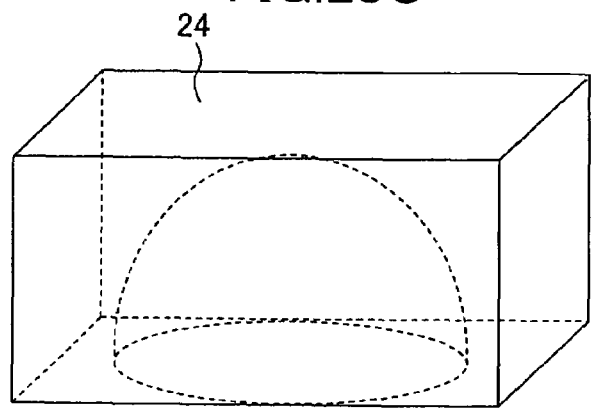
Figure 28B:
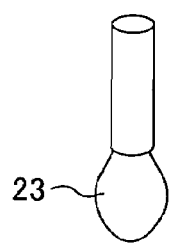
Figure 28B:
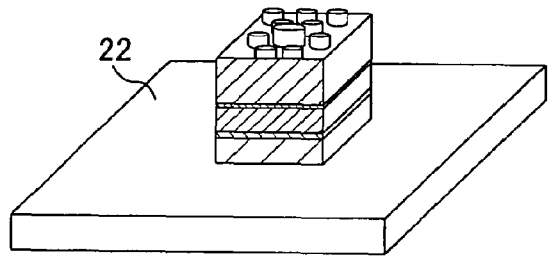

Next, as shown in FIG. 28B, the semiconductor light emitting element is mounted on the mounting substrate 22. Thereafter, the resin 23 is applied dropwise to the semiconductor light emitting element.

Figure 28D:
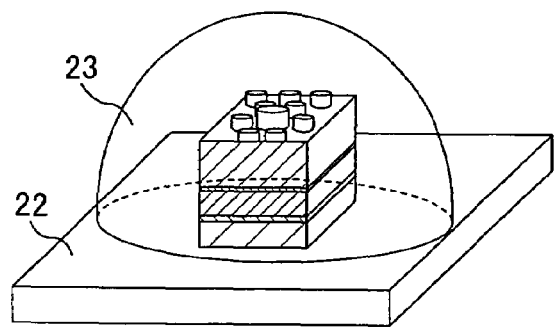

Then, as shown in FIG. 28C, the resin 23 is pressed by using a mold die 24 provided with a hemispherical cavity during the period after the semiconductor light emitting element is covered with the resin 23 and before the resin 23 is set. As a result, the resin 23 is molded into a hemispherical dome-shaped configuration, as shown in FIG. 28D. Thereafter, the resin is set under ultraviolet light. By the method described above, the semiconductor light emitting device according to the present embodiment is fabricated.

Although it has been difficult to form the resin into a hemispherical configuration with high reproducibility by using a conventional technology which simply applies and molds a resin, the fabrication method according to the present embodiment enables stable molding of a resin into the same configuration.

It is to be noted that a method which molds a resin into a hemispherical configuration using a mold die as described above is also applicable to a semiconductor light emitting element according to an embodiment other than the first and second embodiments of the present invention.

Embodiment 4

Figure 29:
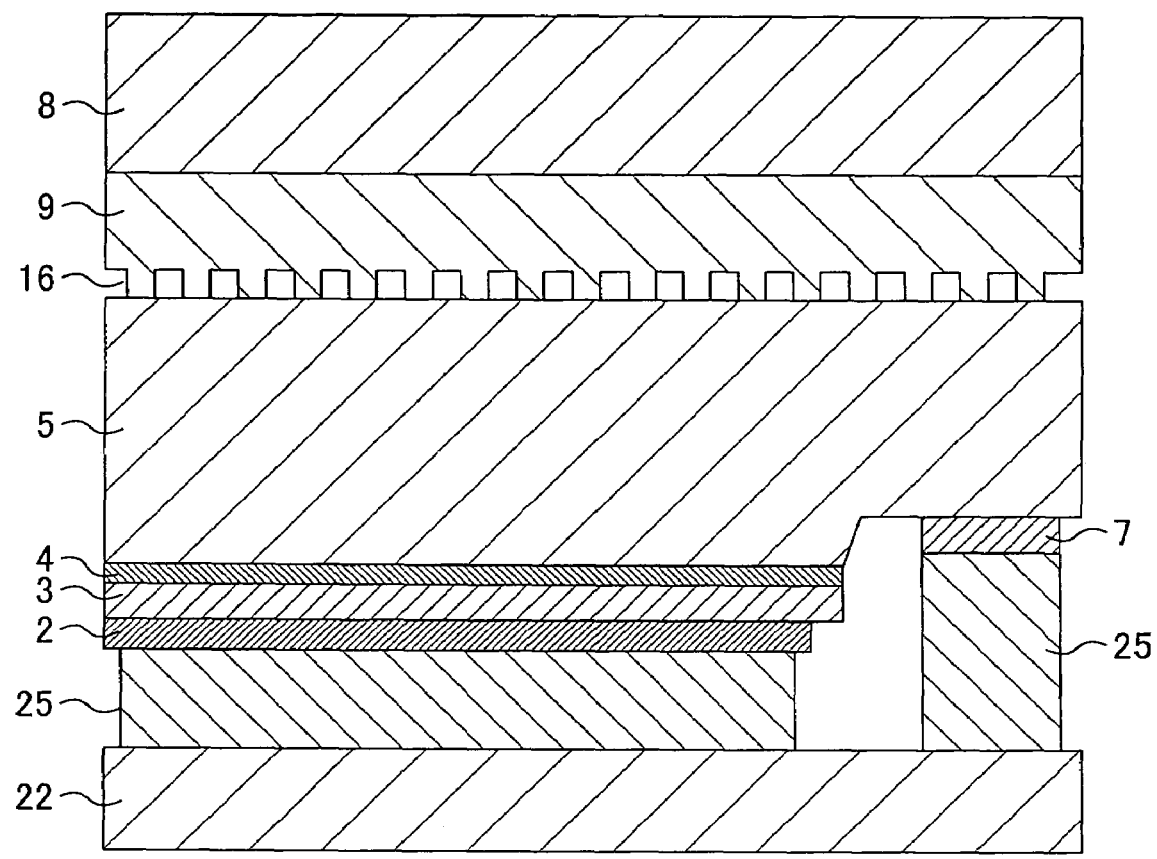
FIG. 29 is a cross-sectional view showing a part of a semiconductor light emitting element according to a fourth embodiment of the present invention.

FIG. 29 is a cross-sectional view showing a part of a semiconductor light emitting element according to a fourth embodiment of the present invention. The semiconductor light emitting element according to the present embodiment is different from the first and second semiconductor light emitting elements in that the sapphire substrate 8 and the AlGaN layer 9 remain mounted on the amounting substrate 22 without being removed and that the high-reflection p electrode 2 and the n electrode 7 are formed on the same side when viewed from the n-type GaN layer 5.

Specifically, the semiconductor light emitting element according to the present embodiment shown in FIG. 29 comprises: the p-type GaN layer 3 formed by epitaxial growth and having a thickness of 200 nm; the high-reflection p electrode 2 formed on the crystal growing surface (principal surface) of the p-type GaN layer 3, made of platinum (Pt) and gold (Au) which are stacked in layers, and having a thickness of 1 μm; the non-doped InGaN active layer 4 formed on the back surface of the p-type GaN layer 3 and having a thickness of 3 nm; an n-type GaN layer 5 formed on the back surface of the non-doped InGaN active layer 4 and having a thickness of 4 μm; the n electrode 7 formed under the n-type GaN layer 5, made of Ti and Al which are stacked in layers, and having a thickness of 1 μm; the AlGaN layer 9 provided on the back surface of the n-type GaN layer 5 and having a principal surface (surface facing the n-type GaN layer 5) formed with the projecting-type two-dimensional periodic structure 16; and the sapphire substrate 8 disposed on the back surface of the AlGaN layer 9. In the example shown in FIG. 29, the semiconductor light emitting device has been mounted on the mounting substrate 22 and the high-reflection p electrode 2 and the n electrode 7 are particularly connected to the mounting substrate 22 via bumps 25 made of Au. The period of the two-dimensional periodic structure 16, i.e., the spacing between the respective centers of the adjacent projections in a two-dimensional plane is 0.4 μm and the height of each of the projections/depressions is 150 nm. In the example shown in FIG. 29, the n-type GaN layer 5 is formed not to be buried in the two-dimensional periodic structure 16. If the n-type GaN layer 5 is formed to be buried in the two-dimensional periodic structure 16, the light extraction efficiency lowers so that it is formed preferably not to be buried therein.

By thus mounting the semiconductor light emitting element with the substrate made of sapphire or the like being left, the light emitted from the non-doped InGaN active layer 4 propagates in the light emitting element without undergoing a loss caused by total reflection or Fresnel reflection since there is substantially no refractive index difference till the AlGaN layer 9 is reached. In the conventional structure, however, the refractive index difference between the sapphire substrate (with a refractive index of 1.6) and the AlGaN layer (with a refractive index of 2.5) is large so that light at a large incident angle is totally reflected at the interface between the sapphire substrate and the AlGaN layer, returns to the inside of the semiconductor multilayer film, and is therefore unextractable to the outside of the LED. By contrast, if a two-dimensional periodic structure is formed in the back surface of an AlGaN layer as in the semiconductor light emitting element according to the present embodiment, diffraction by the two-dimensional periodic structure changes the direction of propagation. As a result, if the back surface of the AlGaN layer is flat, the light at a large incident angle that has been totally reflected at the interface between the sapphire substrate and the AlGaN layer and occupying a large proportion in the solid angle is allowed to be incident on the sapphire substrate without being totally reflected. Since the sapphire substrate is transparent and the refractive index difference between itself and the air is small, the majority of the light incident upon the sapphire substrate is emitted into the air.

In the case where resin molding is performed, the refractive index difference between the sapphire substrate and a resin (with a refractive index of about 1.5) is further reduced and, if the resin is configured as a hemispherical dome, the light extraction efficiency can further be improved.

A description will be given next to a method for fabricating the semiconductor light emitting element according to the present embodiment. FIGS. 30A to 30E are cross-sectional views illustrating the method for fabricating the semiconductor light emitting element according to the present embodiment.

Figure 30A:
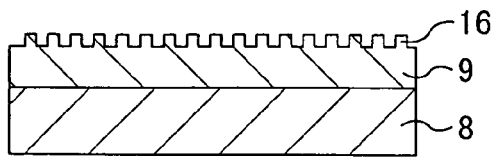
FIGS. 30A to 30E are cross-sectional views illustrating a method for fabricating the semiconductor light emitting element according to the fourth embodiment.

First, as shown in FIG. 30A, the AlGaN layer 9 is formed through crystal growth by, e.g., MOCVD on the sapphire substrate 8. The thickness of the AlGaN layer 9 is assumed herein to be 1 μm for a reduction in crystal defects. The composition of Al in the AlGaN layer 9 is assumed herein to be 100%, though the AlGaN layer 9 may have any Al composition provided that it is transparent relative to the wavelength of light used in a laser lift-off process performed later. Subsequently, the AlGaN layer is patterned into the depressed- or projecting-type two-dimensional periodic structure 16 by exposure using a stepper and RIE. It is assumed herein that the period of the two-dimensional periodic structure 16 is 0.4 μm and the depth of each of the depressions (or the height of each of the projections) is 150 nm.

Figure 30B:
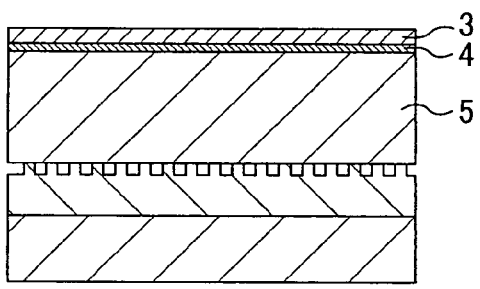

Next, as shown in FIG. 30B, the n-type GaN layer 5, the non-doped InGaN active layer 4, the p-type GaN layer 3 are formed successively by MOCVD on the principal surface of the AlGaN layer 9 formed with the two-dimensional periodic structure 16. The crystal growth of the n-type GaN layer 11 is performed by setting conditions for the growth such that the two-dimensional periodic structure is not filled therewith.

Figure 30C:
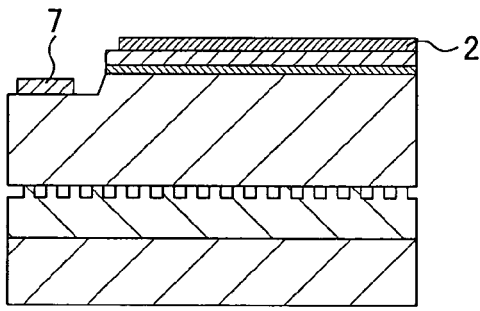

Thereafter, etching is performed with respect to a region to partially expose the principal surface of the n-type GaN layer 5, as shown in FIG. 30C. Then, the Pt/Au high-reflection p electrode 2 is formed on the principal surface of the p-type GaN layer 3, while the Ti/Al n electrode 7 is formed on the exposed portion of the principal surface of the n-type GaN layer 5, each by electron beam vapor deposition.

Figure 30D:
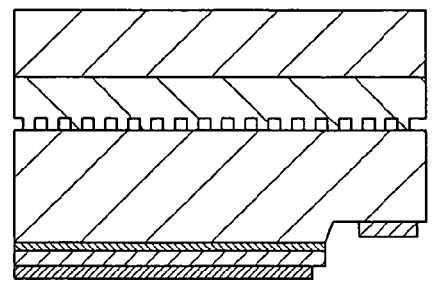
Figure 30D:
Figure 30D:
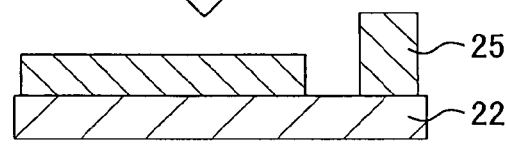
Figure 30E:
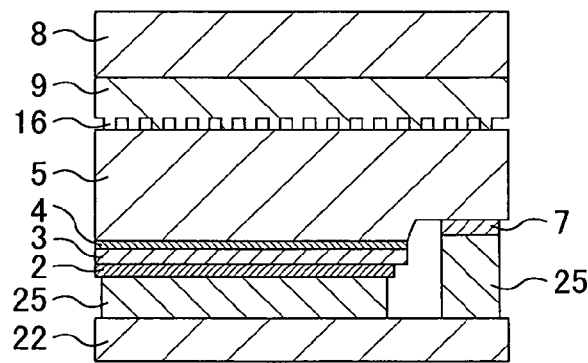

Next, as shown in FIG. 30D, the semiconductor light emitting element is mounted on the mounting substrate 22 formed with the bumps 25 for the n electrode and for the high-reflection p electrode, whereby the semiconductor light emitting element according to the fourth embodiment shown in FIG. 30E is obtained.

In the semiconductor light emitting element thus fabricated, the light extraction efficiency is improved to about double the result of the theoretical calculation shown in FIG. 27B (quadruple the light extraction efficiency achieved in the conventional light emitting element) since, compared with the case where the principal surface of the AlGaN layer 9 is flat, light reflected from the lower surface of the LED due to the high-reflection p electrode 2 can also be used.

In addition, the heat generated in the active layer can be dissipated from the p-type GaN layer 3 as thin as submicron meters through the bumps 25 each having a high thermal conductivity so that an excessive temperature increase is prevented in the semiconductor light emitting element according to the present embodiment. Moreover, the increase rate of the light output from the semiconductor light emitting element to an input current thereto when the input current is small remains unchanged even when a large current of 100 mA flows in the electrode.

Although the present invention has formed the two-dimensional periodic structure in the principal surface of the AlGaN layer 9 on the sapphire substrate 8, the two-dimensional periodic structure may also be formed in the principal surface of the sapphire substrate 8. The substrate may also be composed of any material other than sapphire provided that it is transparent to the light emitted from the active layer.

When the back surface (principal surface) of the sapphire substrate 8 is rough, the light extraction efficiency is improved to 4.5 times the light extraction efficiency achieved in the conventional structure. This is because the presence of the rough back surface reduces a loss resulting from total reflection at the interface between the sapphire substrate and the air. When the back surface of the sapphire substrate 8 is rough, the autocorrelation distance T in the back surface of the sapphire substrate 8 preferably satisfies $0.5\lambda/N < T < 20\lambda/N$ and a height distribution D in a perpendicular direction preferably satisfies $0.5\lambda/N < D < 20\lambda/N$ in terms of sufficiently reducing the loss.

When the semiconductor light emitting element is molded with a hemispherical resin, the light extraction efficiency is improved to 6 times the light extraction efficiency achieved in the conventional structure. This is because the small refractive index difference between the resin and the sapphire reduces the loss resulting from total reflection at the interface between the sapphire substrate and the resin.

In the semiconductor light emitting element according to the present embodiment, a substrate made of one selected from the group consisting of GaAs, InP, Si, SiC, and AlN may also be used instead of the sapphire substrate.

Embodiment 5

FIGS. 31A to 31E are perspective views illustrating a method for fabricating a semiconductor light emitting element according to a fifth embodiment of the present invention. The fabrication method according to the present embodiment is a method for forming a two-dimensional periodic structure in the principal surface of a substrate by using a nano-printing method.

Figure 31A:
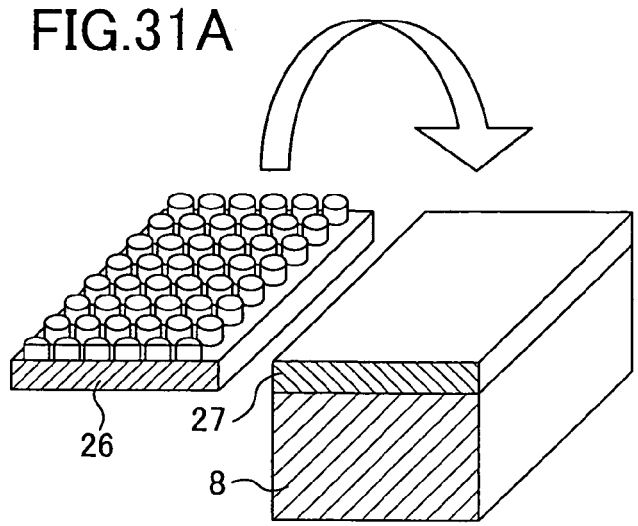
FIGS. 31A to 31E are perspective views illustrating a method for fabricating a semiconductor light emitting element according to a fifth embodiment of the present invention.
Figure 31B:
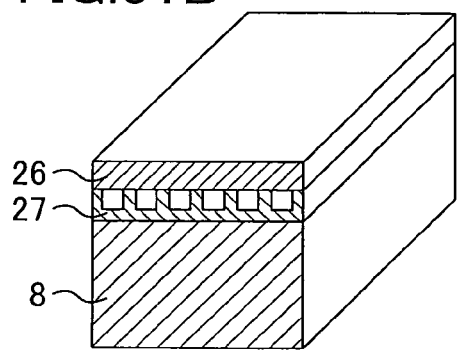

First, as shown in FIGS. 31A and 31B, a Si substrate or a SiC substrate formed with a two-dimensional periodic structure 28 composed of projections each at a height of 400 nm and having a period of 0.4 µm is prepared. Then, the substrate is pressed as a mold 26 against the principal surface of the sapphire substrate 8 coated with a resist 27 having a film thickness of 600 nm.

Figure 31D:
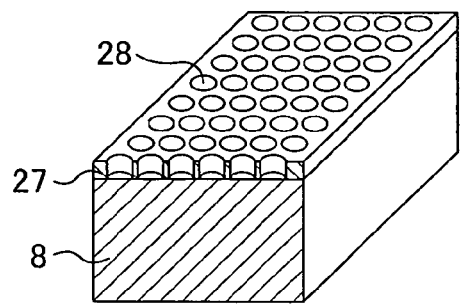
Figure 31C:
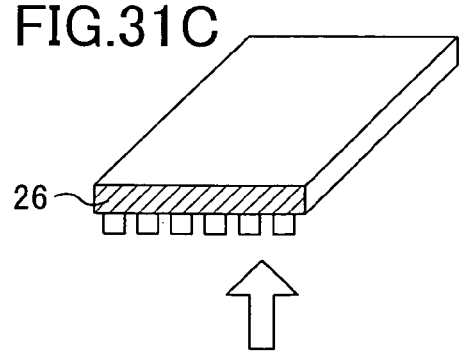

When the mold 26 is removed from the sapphire substrate 8 thereafter, a depressed two-dimensional periodic structure (the depth of each of holes is 400 nm and the period is 0.4 µm) is transferred to the resist 27, as shown in FIG. 31C.

Next, as shown in FIG. 31D, the resist remaining at the bottom of each of the holes in the resist 27 is removed by $O_2$ dry etching.

Figure 31E:
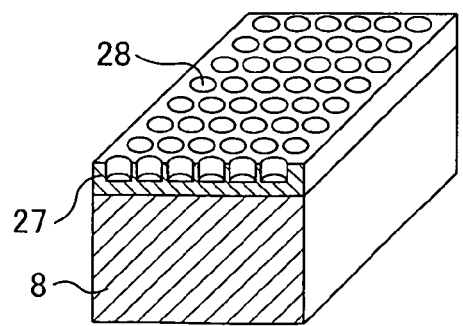

Next, as shown in FIG. 31E, dry etching is performed by using the resist 27 as an etching mask and then the resist 27 is removed, whereby the two-dimensional periodic structure composed of depressions each at a depth of 150 nm and having a period of 0.4 µm is formed in the principal surface of the sapphire substrate 8.

By thus using the nano-printing method, an extremely fine structure on a submicron order can be formed through patterning without using a high-cost manufacturing apparatus such as a stepper or an EB exposure system. In addition, the fabrication method according to the present embodiment can be implemented by merely pressing the mold so that high-speed patterning is performed. If the substrate produced by the foregoing process is used as a mold, the semiconductor light emitting elements according to the first to fourth embodiments can be fabricated at a low cost.

Embodiment 6

FIGS. 32A to 32G are perspective views illustrating a method for fabricating a semiconductor light emitting element according to a sixth embodiment of the present invention. The method for fabricating the semiconductor light emitting element according to the present embodiment is a method for forming a two-dimensional periodic structure in the principal surface of a semiconductor thin film by using a soft mold method.

Figure 32A:
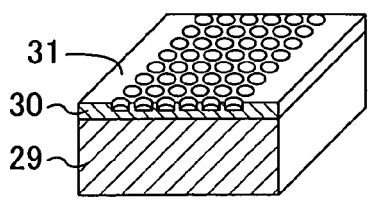
FIGS. 32A to 32G are perspective views illustrating a method for fabricating a semiconductor light emitting element according to a sixth embodiment of the present invention.

First, as shown in FIG. 32A, a soft mold used for micro-processing is produced. In the present step, a two-dimensional periodic structure 31 composed of holes (depressions) each at a depth of 400 nm and having a period of 0.4 µm is formed in a resin 30 such as polysilane coated on a substrate 29 such as a Si substrate or a SiC substrate by using a photolithographic, EB lithographic, or nano-printing process. The substrate with the resin thus produced is used as the soft mold for a micro-processing step performed later.

Figure 32B:
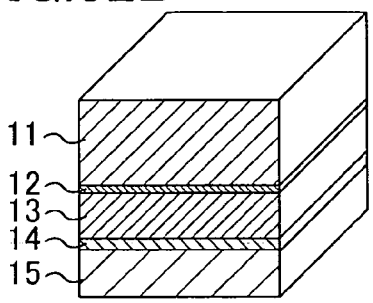

Next, as shown in FIG. 32B, a thin-film semiconductor multilayer film having the Au plating layer 15 is formed by the method described in the first embodiment. In the method according to the present embodiment, however, the surface of the substrate used for the formation of the semiconductor multilayer film is flat so that the surface of the semiconductor multilayer film is also flat.

Figure 32E:
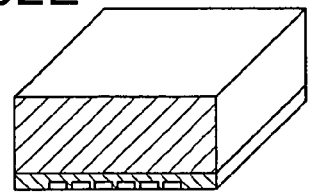
Figure 32C:
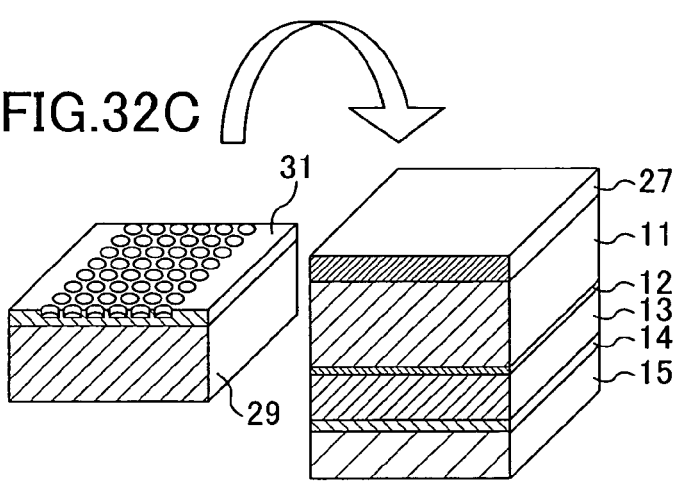

Next, as shown in FIG. 32C, the resist 27 is coated on the principal surface of the semiconductor multilayer film. However, evaporation of a solvent in the resist 27 by baking is not performed herein. The soft mold described above is placed on the resist 27. In this case, the soft mold is placed to exert minimum pressure on the semiconductor multilayer film having a thickness of several micro meters and thereby prevent the destruction thereof.

Figure 32F:
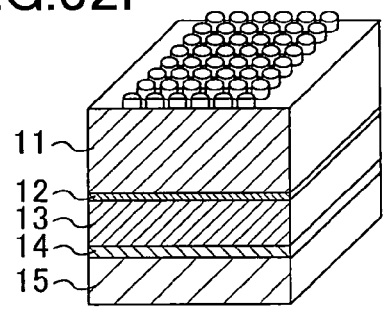
Figure 32D:
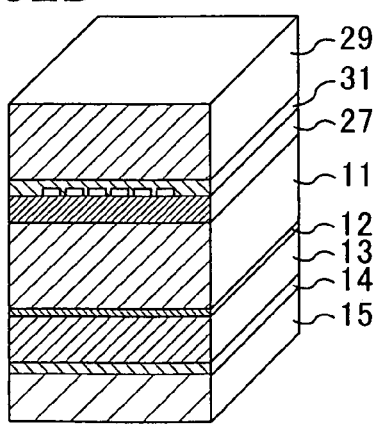

As a result, capillarity occurs as a result of the absorption of the solvent in the resist 27 by the resin 30 so that the resist 27 penetrates in the resin of the soft mold in such a manner as to fill in the holes of the two-dimensional periodic structure, as shown in FIG. 32D.

Thereafter, when the mold is removed from the semiconductor multilayer film, a projecting two-dimensional periodic structure (the height of each of the projections is 400 nm and the period is 0.4 µm) is transferred to the resist 27, as shown in FIG. 32E.

Next, as shown in FIG. 32F, the resist 27 remaining at the bottom of each of the holes in the resist is removed by $O_2$ dry etching.

Figure 32G:
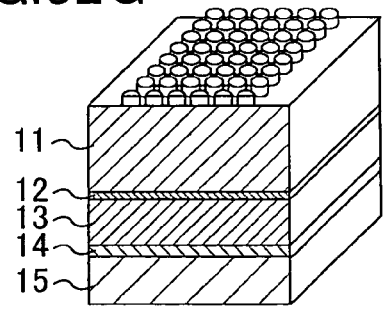

Thereafter, as shown in FIG. 32G, dry etching is performed with respect to the principal surface of the semiconductor multilayer film by using the resist 27 as an etching mask and then the resist is removed, whereby the two-dimensional periodic structure (the height of each of projections is 150 nm and the period is 0.4 µm) is formed in the principal surface of the semiconductor multilayer film.

By thus using the soft mold method, micro-processing on a submicron order can be performed even with respect to a thin film which is extremely difficult to process, such as a semiconductor multilayer film having a thickness on the order of submicron meters. In this case, since a flat substrate can be used satisfactorily for the crystal growth of the semiconductor multilayer film, the crystal growth becomes easier than in the case of crystal growth on a substrate formed with projections/depressions.

Although the embodiments described heretofore have particularly disclosed the nitride-based compound semiconductor which is difficult to process or the case where the period of the projections/depressions becomes smaller in response to the oscillation wavelength of a shorter wavelength of blue or purple light so that micro-processing thereof becomes difficult, the design of the present invention is also applicable to a semiconductor light emitting element which emits infrared light or red light using AlGaAs (with a refractive index of 3.6) or AlGaInP (with a refractive index of 3.5) as a semiconductor.

Embodiment 7

Figure 33:
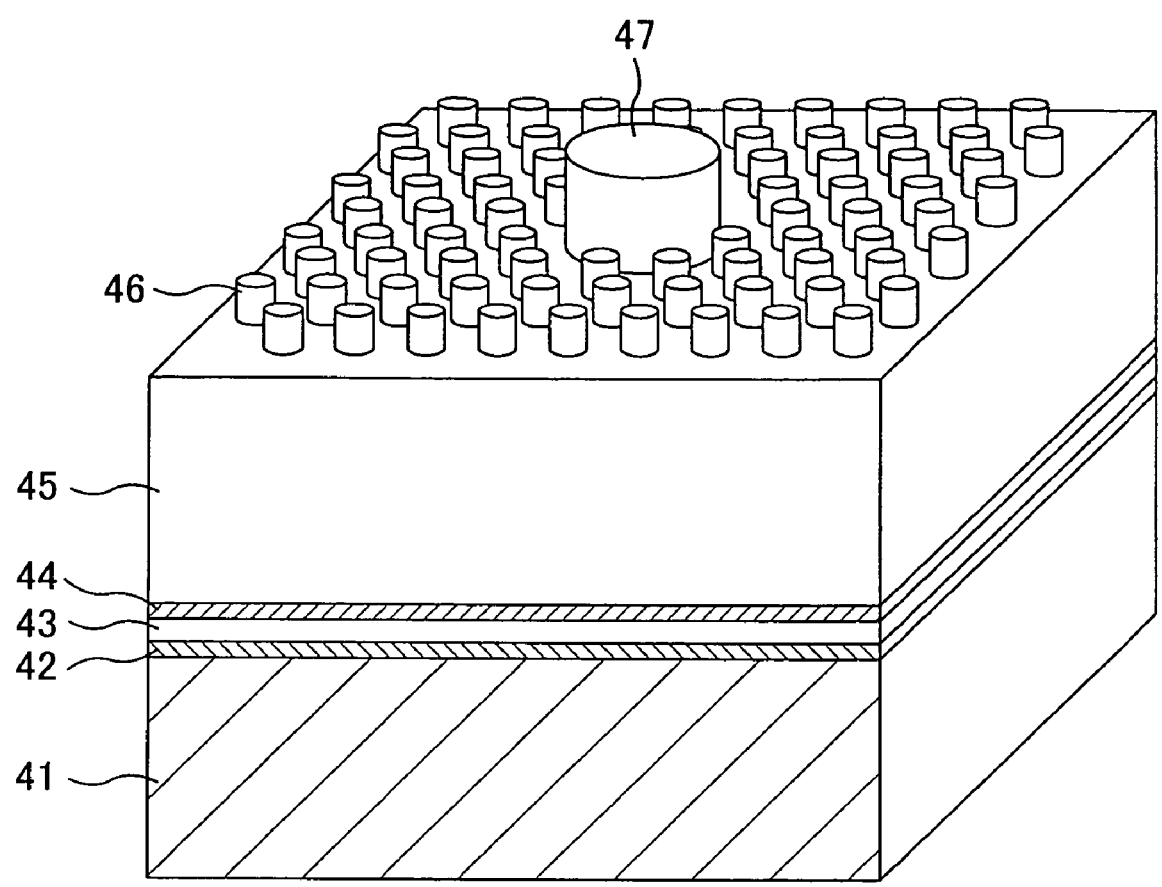
FIG. 33 is a perspective view showing a semiconductor light emitting element according to a seventh embodiment of the present invention.
Figure 34:
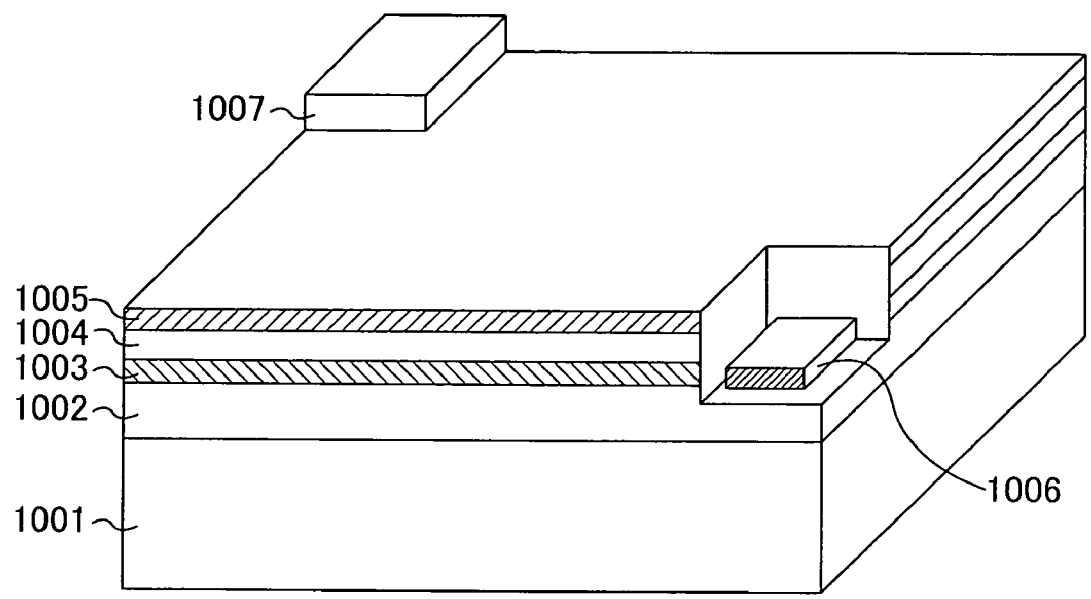
FIG. 34 is a perspective view showing a conventional semiconductor light emitting element.
Figure 35:
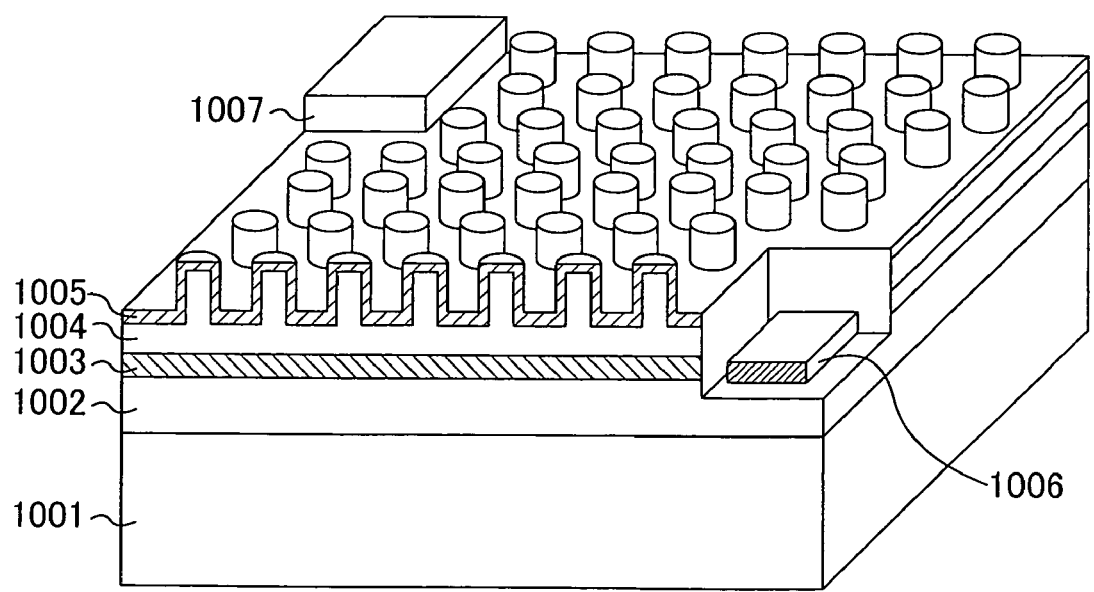
FIG. 35 is a perspective view showing a conventional semiconductor light emitting element having an upper surface formed with a photonic crystal.

FIG. 33 is a perspective view showing a semiconductor light emitting element according to a seventh embodiment of the present invention. As shown in the drawing, the semiconductor light emitting element according to the present embodiment comprises: a p-type AlGaN layer (first semiconductor layer) 43 formed by epitaxial growth and having a thickness of 200 nm; a high-reflection p electrode (first electrode) 42 formed on the crystal growing surface (principal surface) of the p-type AlGaN layer 43, made of Al, and having a thickness of 0.5 µm; an Au plating layer 41 formed on the lower surface of the high-reflection p electrode 2 and having a thickness of 10 µm; a non-doped AlInGaN active layer 44 formed on the back surface of the p-type GaN layer 43 and having a thickness of 3 nm; an n-type AlGaN layer (second semiconductor layer) 45 formed on the back surface of the non-doped AlInGaN active layer 44, having a back surface formed with a projecting-type two-dimensional periodic structure 46, and having a thickness of 4 µm; and an n electrode (second electrode) 47 formed on the back surface of the n-type GaN layer 5, made of titanium (Ti) and Al which are stacked in layers, and having a thickness of 1 µm. The lower surface used herein indicates a surface of a certain layer located in the lower part of FIG. 33.

The semiconductor light emitting element according to the present embodiment functions as an ultraviolet LED from which light is extracted through the back surface of the n-type AlGaN layer 45 and the PL peak wavelength of the non-doped AlInGaN active layer 44 is 350 nm.

The period of the two-dimensional periodic structure 46 formed in the back surface of the n-type AlGaN layer 45, i.e., the spacing between the respective centers of adjacent projections in a two-dimensional plane is 0.3 µm and the height of each of the projections is 130 nm.

The nitride-based compound semiconductor composing the semiconductor light emitting element according to the present embodiment can also be formed by MOCVD or MBE, similarly to the nitride-based compound semiconductor composing the semiconductor light emitting element according to the first embodiment.

The semiconductor light emitting element according to the present embodiment also achieves the same high light extraction efficiency and excellent heat dissipation property as achieved by the semiconductor light emitting element according to the first embodiment. Since the high-reflection p electrode 42 is made of Al, the light generated in the non-doped AlInGaN active layer 44 can be reflected with a particularly high efficiency.

Thus, the structure of a semiconductor light emitting element according to the present invention is also applied effectively to a light emitting element which emits light at an emission wavelength having a peak in the ultraviolet region.

In the semiconductor light emitting element functioning as the ultraviolet LED according to the present embodiment, the high-reflection p electrode (first electrode) 42 may also be made of Al.

Thus, the semiconductor light emitting element according to the present invention is useful as a light source having high emission efficiency.

What is claimed is:

1. A III–V nitride semiconductor light emitting element comprising:
    an active layer made of a semiconductor and generating light;
    a first semiconductor layer of a first conductivity type on a principal surface of the active layer; and
    a second semiconductor layer of a second conductivity type provided on a back surface of the active layer and having a back surface with a two-dimensional periodic structure, the semiconductor light emitting element outputting light generated in the active layer from the back surface of the second semiconductor layer,
    wherein, when a period of the two-dimensional periodic structure is $\Lambda$, a peak wavelength of the light generated in the active layer is $\lambda$, and a refractive index of the first semiconductor layer is N, and $0.63\lambda/N < \Lambda < 8.8\lambda/N$ is satisfied.

2. The semiconductor light emitting element of claim 1, further comprising: a first electrode provided on a principal surface of the first semiconductor layer and having a reflectivity of 80% or more with respect to light at a peak wavelength of all the light generated in the active layer; and
    a second electrode provided on a region of the back surface of the second semiconductor layer in which the two-dimensional periodic structure is not formed.

3. The semiconductor light emitting element of claim 2, wherein the first electrode is a metal film containing at least one of an Au film, a Pt film, a Cu film, an Ag film, an Al film, and a Rh film.

4. The semiconductor light emitting element of claim 2, wherein a metal layer having a thickness of 10 µ.m or more is further provided in contact relation with the first electrode.

5. The semiconductor light emitting element of claim 4, wherein the metal layer is composed of one metal selected from the group consisting of Au, Cu, and Ag.

6. The semiconductor light emitting element of claim 1, wherein a vertical cross section of the two-dimensional periodic structure is configured as a quadrilateral wave.

7. The semiconductor light emitting element of claim 1, wherein a vertical cross section of the two-dimensional periodic structure is configured as a triangular wave.

8. A III–V nitride semiconductor light emitting element comprising:
    an active layer made of a semiconductor and generating light;
    a first semiconductor layer of a first conductivity type on a principal surface of the active layer; and
    a second semiconductor layer of a second conductivity type provided on a back surface of the active layer and having a back surface with a two-dimensional periodic structure, the semiconductor light emitting element outputting light generated in the active layer from the back surface of the second semiconductor layer,
    wherein, when a height of the two-dimensional periodic structure is h, a peak wavelength of the light generated in the active layer is $\lambda$, a refractive index of a portion surrounding the semiconductor light emitting element is $n_1$, and a refractive index of the second semiconductor layer is $n_2$, h is an integral multiple of $\lambda/\{2(n_2-n_1)\}$.

9. A III–V nitride semiconductor light emitting element comprising:
    a substrate which transmits light;
    a first semiconductor layer on a principal surface of the substrate and having a principal surface formed with a two-dimensional periodic structure;
    a second semiconductor layer of a first conductivity type provided on the principal surface of the first semiconductor layer;
    an active layer provided on a principal surface of the second semiconductor layer, made of a semiconductor, and generating light; and
    a third semiconductor layer of a second conductivity type provided on a principal surface of the active layer, the semiconductor light emitting element outputting the light generated in the active layer from a back surface of the substrate,
    wherein, when a period of the two-dimensional periodic structure is $\Lambda$, a peak wavelength of the light generated in the active layer is $\lambda$, and a refractive index of the first semiconductor layer is N, and $0.63\lambda/N < \Lambda < 8.8\lambda/N$ is satisfied.

10. The semiconductor light emitting element of claim 9, wherein a material composing the second semiconductor layer is not buried in the two-dimensional periodic structure.

11. The semiconductor light emitting element of claim 9, further comprising:
    a first electrode provided on a principal surface of the third semiconductor layer and having a reflectivity of 80% or more with respect to light at a peak wavelength of all the light generated in the active layer; and a second electrode provided on the principal surface of the third semiconductor layer.

12. The semiconductor light emitting element of claim 11, wherein the first electrode is a metal film containing at least one of an Au film, a Pt film, a Cu film, an Ag film, an Al film, and a Rh film.

13. The semiconductor light emitting element of claim 9, wherein a vertical cross section of the two-dimensional periodic structure is configured as a quadrilateral.

14. The semiconductor light emitting element of claim 9, wherein a vertical cross section of the two-dimensional periodic structure is configured as a triangular wave.

15. The semiconductor light emitting element of claim 9, wherein a material of the substrate is one selected from the group consisting of GaAs, InP, Si, SiC, AlN, and sapphire.

16. The semiconductor light emitting element of claim 9, wherein the back surface of the substrate is rough and, when a peak wavelength of the light generated in the active layer is $\lambda$, an autocorrelation distance T in the back surface of the substrate satisfies $0.5\lambda/N < T < 20\lambda/N$ and a height distribution D in a perpendicular direction satisfies $0.5\lambda/N < D < 20\lambda/N$.

17. A III–V nitride semiconductor light emitting element comprising:

a substrate which transmits light;

a first semiconductor layer on a principal surface of the substrate and having a principal surface formed with a two-dimensional periodic structure;

a second semiconductor layer of a first conductivity type provided on the principal surface of the first semiconductor layer;

an active layer provided on a principal surface of the second semiconductor layer, made of a semiconductor, and generating light; and a third semiconductor layer of a second conductivity type provided on a principal surface of the active layer, the semiconductor light emitting element outputting the light generated in the active layer from a back surface of the substrate, wherein, when a height of the two-dimensional periodic structure is h, a peak wavelength of the light generated in the active layer is $\lambda$, a refractive index of a portion surrounding the semiconductor light emitting element is $n_1$, and a refractive index of the first semiconductor layer is $n_2$, h is an integral multiple of $\lambda/\{2(n_2-n_1)\}$.

18. A III–V nitride semiconductor light emitting device comprising:

a semiconductor light emitting element having a first semiconductor layer of a first conductivity type, an active layer provided on a back surface of the first semiconductor layer, made of a semiconductor, and generating light, and a second semiconductor layer of a second conductivity type provided on a back surface of the active layer and having a back surface formed with a two-dimensional periodic structure, the semiconductor light emitting element outputting the light generated in the active layer from the back surface of the second semiconductor layer;

a mounting substrate on which the semiconductor light emitting element is mounted; and a molding resin formed into a hemispherical configuration to mold the semiconductor light emitting element, wherein, when a period of the two-dimensional periodic structure is $\Lambda$, a peak wavelength of the light generated in the active layer is $\lambda$, and a refractive index of the second semiconductor layer is N, and $0.63\lambda/N < \Lambda < 8.8\lambda/N$ is satisfied.

* * * * *